(12) United States Patent
Umeda

(10) Patent No.: US 10,360,321 B2
(45) Date of Patent: Jul. 23, 2019

(54) MODEL GENERATION METHOD AND INFORMATION PROCESSING APPARATUS

(71) Applicant: FUJITSU LIMITED, Kawasaki-shi, Kanagawa (JP)

(72) Inventor: Yuhei Umeda, Kawasaki (JP)

(73) Assignee: FUJITSU LIMITED, Kawsasaki (JP)

( * ) Notice: Subject to any disclaimer, the term of this patent is extended or adjusted under 35 U.S.C. 154(b) by 507 days.

(21) Appl. No.: 15/054,258

(22) Filed: Feb. 26, 2016

(65) Prior Publication Data

US 2016/0259871 A1 Sep. 8, 2016

(30) Foreign Application Priority Data

Mar. 2, 2015 (JP) ................................ 2015-040522
Dec. 1, 2015 (JP) ................................ 2015-235215

(51) Int. Cl.
*G06F 17/50* (2006.01)
*F02D 41/24* (2006.01)
*F02D 41/14* (2006.01)

(52) U.S. Cl.
CPC ..... *G06F 17/5009* (2013.01); *F02D 41/2432* (2013.01); *F02D 2041/1433* (2013.01)

(58) Field of Classification Search
CPC .. G06F 17/5009; G06F 17/15; F02D 41/2432; F02D 2041/1433

(Continued)

(56) References Cited

U.S. PATENT DOCUMENTS 5,953,238 A * 9/1999 Mowry ................. G05B 17/02
 703/18
6,285,961 B1 9/2001 Jahkonen et al.
(Continued)

FOREIGN PATENT DOCUMENTS

JP 10002993 1/1998
JP 2000-516189 A 12/2000
(Continued)

OTHER PUBLICATIONS

K. Shimojo, Y. Kitamura, M. Sato, S. Ka, and S. Adachi, Soot Modeling for Gasoline Engine using Quasi-Stationary Measurement, SICE 2014.
(Continued)

*Primary Examiner* — Thai Q Phan
(74) *Attorney, Agent, or Firm* — Staas & Halsey LLP

(57) ABSTRACT

A non-transitory computer-readable recording medium stores a model generation program that causes a computer to execute a process. The process includes obtaining measurement data on measurement points sequentially measured along a measurement path curve generated from a Hilbert curve laid out in a normalized space in which measurement target ranges of respective plurality of control parameters related to control of an object to be measured are normalized, the measurement points being more in number in a specific area of the measurement target ranges than in an area other than the specific area, and the numbers of measurement points lying on two sides in each group of two adjacent sides of the measurement path curve and where a control parameter changes in opposite directions being balanced; and generating a control model of the object to be measured on the basis of the obtained measurement data of the measurement points.

7 Claims, 17 Drawing Sheets

(58) Field of Classification Search
USPC .......................................................... 703/2, 6
See application file for complete search history.

(56) References Cited

U.S. PATENT DOCUMENTS

| | | | |
|---|---|---|---|
| 6,473,809 B1 | 10/2002 | Aref et al. | |
| 6,636,847 B1 | 10/2003 | Spires | |
| 7,194,317 B2* | 3/2007 | Kothare | G05B 17/02 |
| | | | 700/28 |
| 8,260,589 B1* | 9/2012 | Kumar | G06F 17/5009 |
| | | | 703/2 |
| 2004/0225638 A1* | 11/2004 | Geiselhart | G06F 17/3061 |
| 2005/0107895 A1* | 5/2005 | Pistikopoulos | G05B 13/048 |
| | | | 700/52 |
| 2009/0198474 A1* | 8/2009 | Fritz | G01M 15/06 |
| | | | 702/183 |
| 2010/0017094 A1* | 1/2010 | Stewart | G05B 15/02 |
| | | | 701/102 |
| 2011/0077837 A1* | 3/2011 | Ejiri | F02D 41/0007 |
| | | | 701/102 |
| 2013/0339371 A1 | 12/2013 | Hayashi et al. | |
| 2016/0259871 A1* | 9/2016 | Umeda | G06F 17/5009 |
| 2017/0260924 A1* | 9/2017 | Umeda | F02D 41/1401 |

FOREIGN PATENT DOCUMENTS

| | | |
|---|---|---|
| JP | 2001-134385 A | 5/2001 |
| JP | 2008-77376 | 4/2008 |
| JP | 2009168812 | 7/2009 |
| JP | 2013-152172 A | 8/2013 |
| JP | 2014-2519 | 1/2014 |

OTHER PUBLICATIONS

Notification of Reasons for Refusal for Japanese Patent Application No. 2015-040522, dated Nov. 13, 2018.

* cited by examiner

FIG.6

| TIME | 1 | 2 | 3 | 4 | 5 | 6 |
|---|---|---|---|---|---|---|
| MEASUREMENT CONDITION | U(1) | U(2) | U(3) | U(4) | U(5) | U(6) |
| MEASUREMENT DATA | X(1) | X(2) | X(3) | X(4) | X(5) | X(6) |

⇩

| MEASUREMENT CONDITION | U(1) | U(2) | U(3) | U(4) | U(5) | U(6) |
|---|---|---|---|---|---|---|
| MEASUREMENT DATA | X(4) | X(5) | X(6) | X(7) | X(8) | X(9) |

MODEL GENERATION METHOD AND INFORMATION PROCESSING APPARATUS

CROSS-REFERENCE TO RELATED APPLICATIONS

This application is based upon and claims the benefit of priority of the prior Japanese Patent Application No. 2015-040522, filed on Mar. 2, 2015, and the prior Japanese Patent Application No. 2015-235215, filed on Dec. 1, 2015, the entire contents of which are incorporated herein by reference.

FIELD

The embodiments discussed herein are related to an information processing apparatus, a model generation program, and a model generation method.

BACKGROUND

Control design has conventionally been practiced. The control design includes, with a target object of the control design as an object to be measured, changing a setting value of a parameter used to control the object to be measured and measuring a state of the object to be measured after a wait for the state of the object to be measured to reach a stationary state. In the control design, a model of the object to be measured is then generated on the basis of the resulting measurement data.

If measurement is performed with respect to each of measurement conditions with a wait for the state of the object to be measured to reach a stationary state, it takes time to collect measurement data. A technique for performing quasi-stationary measurement has thus been proposed. In quasi-stationary measurement, the setting value of a parameter is changed at speed such that the parameter can be regarded as being stationary, and the obtainable time-series data is used as data in a stationary state.

Patent Literature 1: Japanese Laid-open Patent Publication No. 2008-077376

Patent Literature 2: Japanese Laid-open Patent Publication No. 2014-002519

Non-Patent Literature 1: Shimojo, Kanako, et al., "Soot Modeling Using Quasi-Stationary Measurement for Gasoline Engine," The 1st Society of Instrument and Control Engineers Multi-Symposium on Control Systems, 2014

Quasi-stationary measurement is used if there is one parameter. However, as devices and the like increase, a plurality of parameters may sometimes be used to control an object to be measured. In the case of using a plurality of parameters, a model of the object to be measured is difficult to generate by quasi-stationary measurement.

SUMMARY

According to an aspect of an embodiment, a non-transitory computer-readable recording medium stores a model generation program that causes a computer to execute a process. The process includes obtaining measurement data on measurement points sequentially measured along a measurement path curve generated from a Hilbert curve laid out in a normalized space in which measurement target ranges of respective plurality of control parameters related to control of an object to be measured are normalized, the measurement points being more in number in a specific area of the measurement target ranges than in an area other than the specific area, and the numbers of measurement points lying on two sides in each group of two adjacent sides of the measurement path curve and where a control parameter changes in opposite directions being balanced; and generating a control model of the object to be measured on the basis of the obtained measurement data of the measurement points.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a diagram for describing correspondence between measurement data and measurement conditions;

DESCRIPTION OF EMBODIMENTS

Preferred embodiments of the present invention will be explained with reference to accompanying drawings. Furthermore, each embodiment is not a limitation of the disclosed technology.

[a] First Embodiment

System Configuration

Control design designs how to control an object to be measured by using a model generated from measurement data measured from the object to be measured. A system 1 is a system for generating a model of an object to be measured. With an engine as the object to be measured, the present embodiment will be described by using a case of performing control design of the engine as an example. To determine numerical values used to control the engine, the control design of the engine includes measuring how a state of the engine changes depending on operations on the engine, and generating a model of the engine on the basis of the resulting measurement data. For example, in the control design of the engine, how exhaust gas and gas mileage change with a change in a valve opening and the amount of fuel injection is measured, and a model is generated. In the control design of the engine, how to control the engine is then designed by using the generated model. For example, in the control design of the engine, the valve opening and the amount of fuel injection suitable to suppress exhaust gas and improve gas mileage while providing desired output are designed.

Figure 1:
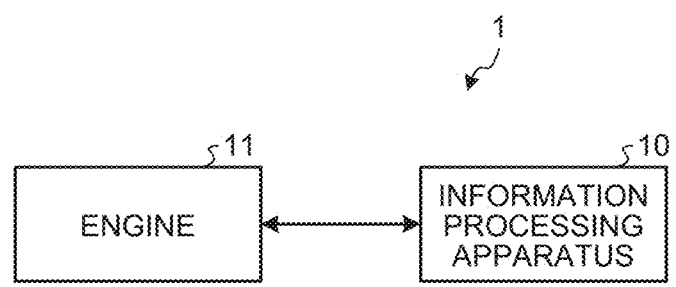
FIG. 1 is an explanatory diagram for describing an example of a system configuration.

FIG. 1 is an explanatory diagram for describing an example of a system configuration. As illustrated in FIG. 1, the system 1 includes an information processing apparatus 10 and an engine 11.

The engine 11 is the target object of the control design.

The information processing apparatus 10 is an apparatus that generates a model of the engine 11. For example, the information processing apparatus 10 is a computer such as a personal computer and a server computer. The information processing apparatus 10 may be implemented as a single computer. The information processing apparatus 10 may be implemented by a plurality of computers. The present embodiment will be described by using, as an example, a case where the information processing apparatus 10 is a single computer.

The information processing apparatus 10 operates the engine 11 under various measurement conditions. For example, the information processing apparatus 10 changes a measurement condition set in parameters for controlling the engine 11, and outputs an operation instruction to the engine 11. The parameters are input information for the model in the control design. Examples of the parameters for controlling the engine 11 include a valve opening and the amount of fuel injection. The parameters are not limited thereto.

The information processing apparatus 10 obtains measurement data indicating the state of the engine 11 under various measurement conditions. For example, the information processing apparatus 10 obtains the measurement data indicating the state of the engine 11 under various measurement conditions in which only one of a plurality of parameters is changed from an immediately previous measurement condition. In each measurement condition, the information processing apparatus 10 changes the value of any one of the parameters from the immediately previous measurement condition at low speed such that the parameter can be regarded as being substantially stationary. The information processing apparatus 10 regards and uses the measurement data sequentially obtained while changing any one of the parameters at low speed as data in a stationary state. For example, the information processing apparatus 10 changes the valve opening and the amount of fuel injection one at a time at low speed such that the valve opening or the amount of fuel injection can be regarded as being substantially stationary, and obtains measurement data indicating the state of the engine 11. Examples of the measurement data to obtain include the concentrations of $NO_x$ (nitrogen oxides), PM (particulate matter), and $CO_2$ (carbon dioxide) contained in exhaust gas, and data on gas mileage.

Configuration of Information Processing Apparatus

Figure 2:
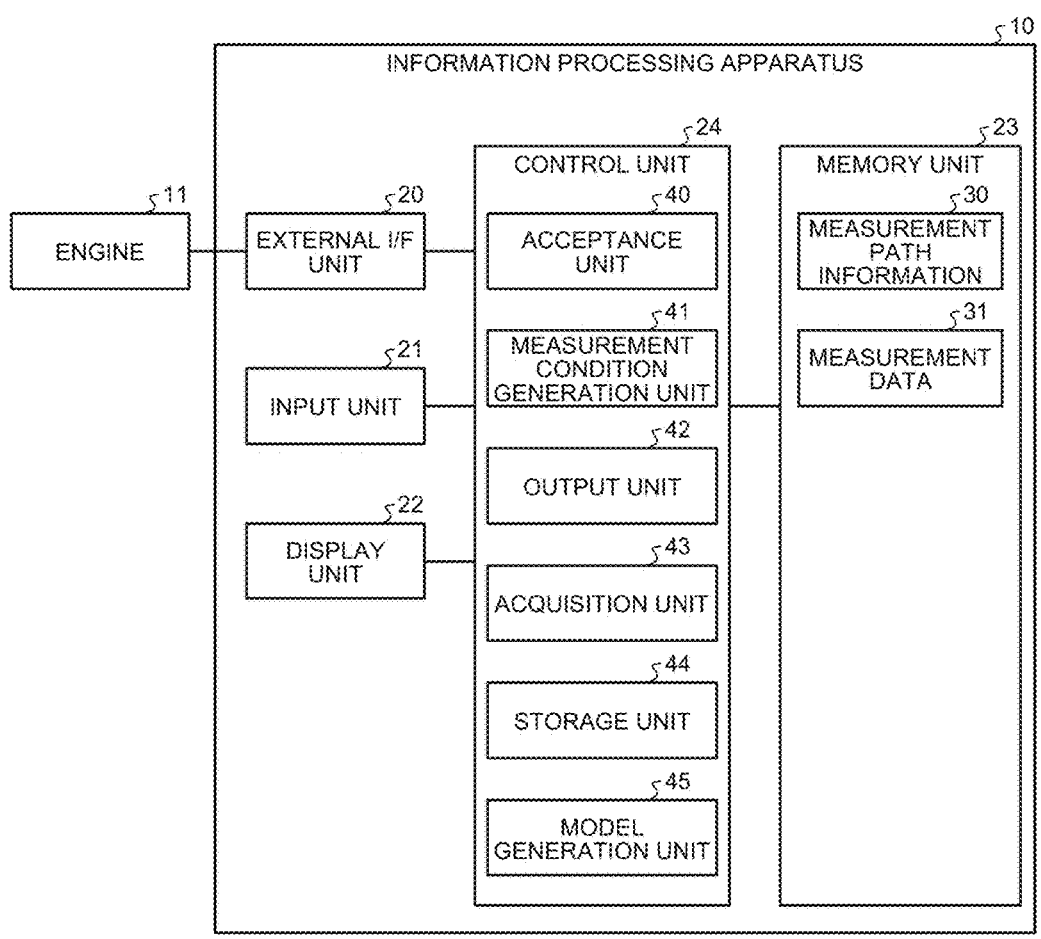
FIG. 2 is a diagram illustrating an example of a functional configuration of an information processing apparatus according to a first embodiment.

Next, the information processing apparatus 10 according to the present embodiment will be described. FIG. 2 is a diagram illustrating an example of a functional configuration of the information processing apparatus according to a first embodiment. As illustrated in FIG. 2, the information processing apparatus 10 includes an external interface (I/F) unit 20, an input unit 21, a display unit 22, a memory unit 23, and a control unit 24. The information processing apparatus 10 may include devices other than the foregoing.

The external I/F unit 20 is an interface that inputs and outputs information from/to other apparatuses. Various types of input/output ports such as Universal Serial Bus (USB) and network interface cards such as a LAN card may be employed for the external I/F unit 20.

The external I/F unit 20 transmits and receives various types of information to/from other apparatuses via a not-illustrated communication cable or cables. For example, the external I/F unit 20 outputs an operation instruction specifying a measurement condition to a not-illustrated control apparatus for controlling the engine 11. The control apparatus operates the engine 11 under the specified measurement condition. The control apparatus measures the state of the engine 11 at predetermined cycles. For example, the control apparatus measures the concentrations of $NO_x$, PM, and $CO_2$ contained in the exhaust gas of the engine 11 and gas mileage at cycles of 16 ms. The control apparatus then associates the data indicating the measured state of the engine 11 with measurement time, and outputs the resultant as measurement data at predetermined cycles. In other words, the control apparatus outputs the measurement data in time-series order upon each measurement. The external I/F unit 20 receives the measurement data output from the control apparatus.

The input unit 21 is an input device that inputs various types of information. Examples of the input unit 21 include input devices for accepting an operation input, such as a mouse and a keyboard. The input unit 21 accepts input of various types of information about the control design. For example, the input unit 21 inputs a measurement target range in which to change a parameter for measurement, with respect to each parameter for controlling the engine 11. The input unit 21 also accepts input of change speed at which to change a parameter, with respect to each parameter for controlling the engine 11. The input unit 21 also accepts input of a period to elapse before measurement data corresponding to a measurement condition is obtained, with respect to each parameter for controlling the engine 11. In the following description, the period to elapse before measurement data corresponding to a measurement condition is obtained may be referred to as "idle time." The input unit 21 accepts operation inputs from a user, and inputs operation information indicating the accepted operation contents to the control unit 24.

The display unit 22 is a display device that displays various types of information. Examples of the display unit 22 include display devices such as a liquid crystal display (LCD) and a cathode-ray tube (CRT). The display unit 22 displays various types of information. For example, the display unit 22 displays various screens including an operation screen.

The memory unit 23 is a storage device that stores various types of data. Examples of the memory unit 23 include storage devices such as a hard disk, a solid state drive (SSD), and an optical disk. The memory unit 23 may be a data-rewritable semiconductor memory such as a random access memory (RAM), a flash memory, and a non-volatile static random access memory (NVSRAM).

The memory unit 23 stores an operating system (OS) and various programs to be executed by the control unit 24. For example, the memory unit 23 stores various programs including a program for performing model generation processing to be described later. The memory unit 23 further stores various types of data used by the programs executed by the control unit 24. For example, the memory unit 23 stores measurement path information 30 and measurement data 31.

The measurement path information 30 is data that stores how to change the measurement conditions set into the parameters for controlling the engine 11. For example, the measurement path information 30 stores a plurality of measurement conditions about parameters in order of change.

The measurement data 31 is data that stores measurement data on the engine 11. The measurement data 31 stores pieces of measurement data for respective measurement conditions in association with the measurement conditions.

The control unit 24 is a device that controls the information processing apparatus 10. Electronic circuits such as a central processing unit (CPU) and a micro processing unit (MPU) and integrated circuits such as an application specific integrated circuit (ASIC) and a field programmable gate array (FPGA) may be employed for the control unit 24. The control unit 24 includes an internal memory for storing a program(s) defining various processing procedures and control data, whereby the control unit 24 executes various types of processing. The control unit 24 functions as various processing units through the operation of various programs. For example, the control unit 24 includes an acceptance unit 40, a measurement condition generation unit 41, an output unit 42, an acquisition unit 43, a storage unit 44, and a model generation unit 45.

The acceptance unit 40 performs various types of acceptance. For example, the acceptance unit 40 accepts various operation instructions about the control design. For example, the acceptance unit 40 displays an operation screen about the control design on the display unit 22, and accepts input of an operation instruction for giving instructions to start the generation of a model from the operation screen. The acceptance unit 40 accepts input of a measurement target range of a parameter from the operation screen, with respect to each parameter for controlling the engine 11. The acceptance unit 40 accepts input of a change speed at which to change a parameter, with respect to each parameter for controlling the engine 11. The acceptance unit 40 accepts input of idle time with respect to each parameter for controlling the engine 11. For example, the measurement target range of each parameter is determined by the user according to the range of the parameter for modeling the engine 11. For example, the change speed of each parameter is determined by the user individually changing each parameter and observing a change in the state of the engine 11 in advance. The user determines the change speed such that the change in the state of the engine 11 can be regarded as being substantially stationary. For example, the idle time of each parameter is determined by the user individually changing each parameter and observing a change in the state of the change 11 in advance.

The measurement condition generation unit 41 generates a plurality of measurement conditions about a plurality of parameters for controlling the object to be measured, in association with predetermined order. For example, the measurement condition generation unit 41 generates a plurality of measurement conditions by changing only one of a plurality of parameters for controlling the object to be measured from an immediately previous measurement condition in a space formed by the measurement target ranges of the respective plurality of parameters. For example, the measurement condition generation unit 41 generates a plurality of measurement conditions in which only one of a plurality of parameters changes from an immediately previous measurement condition, the measurement conditions changing in a comprehensive manner within the space formed by the measurement target ranges of the plurality of parameters. For example, the measurement condition generation unit 41 generates a plurality of measurement conditions by using a space-filling curve laid out in a normalized space in which the measurement target ranges of a respective plurality of parameters are normalized. A space-filling curve refers to a curve that changes in a comprehensive manner within a space formed by a plurality of parameters, by sequentially changing the value of any one of the parameters in the space. For example, a Hilbert curve is used as the space-filling curve.

Figure 3:
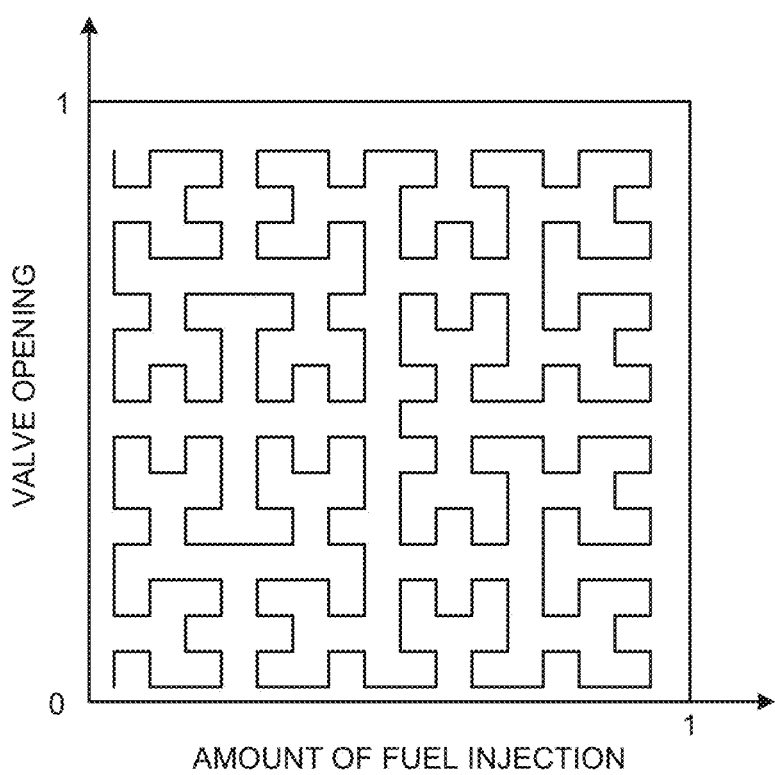
FIG. 3 is a diagram illustrating an example of a normalized space.
Figure 4:
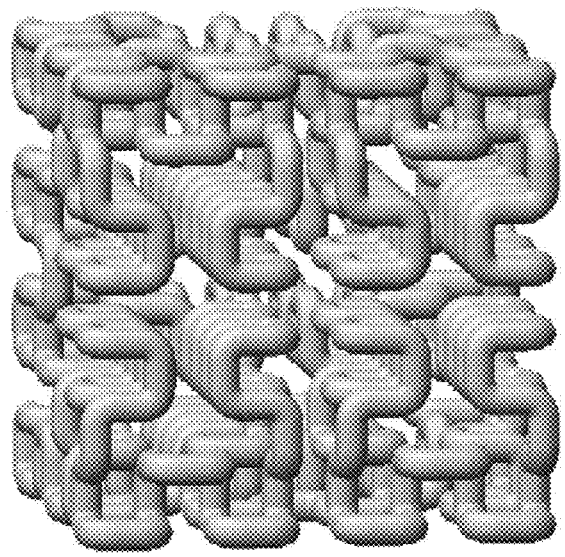
FIG. 4 is a diagram illustrating an example of a three-dimensional Hilbert curve.

A flow of generation of measurement conditions will be described by using a specific example. The measurement condition generation unit 41 normalizes the measurement target ranges of the valve opening and the amount of fuel injections for controlling the engine 11 within a range of 0 to 1 each. FIG. 3 illustrates an example of the normalized space. The normalized space formed by normalizing the measurement target ranges of the valve opening and the amount of fuel injection is a two-dimensional space in which the valve opening and the amount of fuel injection range between 0 and 1. The measurement condition generation unit 41 lays out a Hilbert curve in the normalized space. FIG. 3 illustrates an example of the two-dimensional Hilbert curve. A Hilbert curve is a fractal obtained by repeating a U-shaped trace in a recursive manner. A Hilbert curve is a space-filling curve of which the limits of the repetitions coincide with the region. A Hilbert curve is a traversable curve configured by combining one-parameter changes. Since a Hilbert curve is a space-filling curve, the resulting curve formed by some repetitions fills the region in a comprehensive manner. Most of the portions of a Hilbert curve have reversely-changing portions nearby. A Hilbert curve can be generated in any number of dimensions. FIG. 4 is a diagram illustrating an example of a three-dimensional Hilbert curve.

An example of a method for configuring a two-dimensional Hilbert curve will be described. A two-dimensional Hilbert curve can be drawn in four ways (RUL(n), DLU(n), LDR(n), and URD(n)), depending on the starting condition. n is the number of repetitions (order). A Hilbert curve of each order is drawn by rules expressed by the following Eqs. (1) to (4).

$$RUL(n)=URD(n-1){\rightarrow}RUL(n-1){\uparrow}RUL(n-1){\leftarrow}DLU(n-1) \quad (1)$$

$$DLU(n)=LDR(n-1){\downarrow}DLU(n-1){\leftarrow}DLU(n-1){\uparrow}RUL(n-1) \quad (2)$$

$$LDR(n)=DLU(n-1){\leftarrow}LDR(n-1){\downarrow}LDR(n-1){\rightarrow}URD(n-1) \quad (3)$$

$$URD(n)=RUL(n-1){\uparrow}URD(n-1){\rightarrow}URD(n-1){\downarrow}LDR(n-1) \quad (4)$$

Here, RUL(0)=DLU(0)=LDR(0)=URD(0)="". "" represents no operation.

Figure 5:
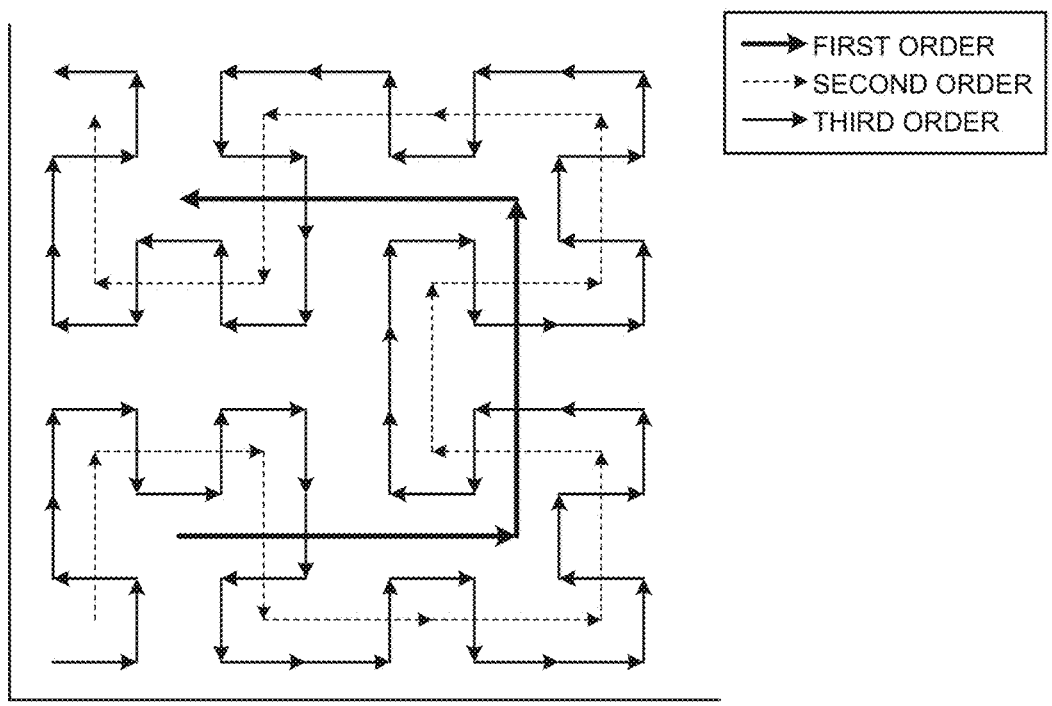
FIG. 5 is a diagram illustrating an example of first to third order two-dimensional Hilbert curves.

RUL(n) will be described in specific terms. A Hilbert curve RUL(n) is configured by dividing each side of a square region into 2n equal parts to form small square regions, and successively connecting the centers of adjoining square regions with line segments according to the arrows, starting at the center of the lowermost, leftmost small square region. FIG. 5 is a diagram illustrating an example of first to third order two-dimensional Hilbert curves.

From Eq. (1), a Hilbert curve of order n=1, RUL(1), is given by the following.

$$RUL(1) = URD(0) \rightarrow RUL(0) \uparrow RUL(0) \leftarrow DLU(0)$$

$$= \rightarrow \uparrow \leftarrow$$

The Hilbert curve RUL(1) is obtained by connecting the centers of the four small square regions formed by dividing each side of a square region into to two equal parts, in order of the lower left, lower right, upper right, and upper left.

Similarly, a Hilbert curve of order n=2, RUL(2), is given by the following.

$$RUL(2) = URD(1) \rightarrow RUL(1) \uparrow RUL(1) \leftarrow DLU(1)$$

$$= (\uparrow \rightarrow \downarrow) \rightarrow (\rightarrow \uparrow \leftarrow) \uparrow (\rightarrow \uparrow \leftarrow) \leftarrow (\downarrow \leftarrow \uparrow)$$

$$= \uparrow \rightarrow \downarrow \rightarrow \uparrow \leftarrow \uparrow \rightarrow \uparrow \leftarrow \leftarrow \downarrow \leftarrow \uparrow$$

The Hilbert curve RUL(2) is a curve obtained by connecting the centers of the 16 small square regions formed by dividing each side of a square region into four equal parts, in the order of the arrows from the lowermost, leftmost.

The measurement condition generation unit 41 normalizes the measurement target ranges of the valve opening and the amount of fuel injection into a range of 0 to 1 each. The measurement condition generation unit 41 lays out a Hilbert curve in association such that the center of the lowermost, leftmost small square in the resulting two-dimensional normalized space is (0,0), and the center of the uppermost, rightmost small square is (1,1).

The measurement condition generation unit 41 restores the normalized space in which the Hilbert curve is laid out to the original space formed by the respective measurement target ranges of the valve opening and the amount of fuel injection, and associates the Hilbert curve with the original space. The curve formed by associating the Hilbert curve with the original space is a measurement path curve which indicates the path of actual measurement. The measurement condition generation unit 41 generates measurement conditions along the measurement path curve. Even in the original space, the measurement path curve changes in only one of the parameters at a time. The measurement condition generation unit 41 generates a measurement condition for changing the value of a parameter to change at the change speed of the parameter. For example, if the change speed of the parameter is 1 per second, the measurement condition generation unit 41 generates a measurement condition for changing the value of the parameter by 1 per second. In such a manner, measurement conditions in which only one of the parameters change from an immediately previous measurement condition and the parameters change in a comprehensive manner within the space formed by the measurement target ranges of the respective parameters are generated.

The measurement condition generation unit 41 stores the generated measurement conditions into the measurement path information 30 in order along the measurement path curve. In other words, the measurement condition generation unit 41 stores a plurality of measurement conditions into the measurement path information 30 in association with the order of change.

The output unit 42 outputs operation instructions specifying measurement conditions from the external I/F unit 20 to the not-illustrated control apparatus that controls the engine 11. For example, the output unit 42 outputs an operation instruction for making the engine 11 operate under a measurement condition according to the order in which the measurement conditions are stored in the measurement path information 30. With the parameter changed by the measurement condition, the engine 11 operates under the measurement condition. According to the operation instruction, any one of the parameters of the engine 11 changes at low speed such that the parameter can be regarded as being stationary. The external I/F unit 20 receives measurement data indicating the state of the engine 11 of which the parameter is changed by the measurement condition in time series. The measurement data received in time series can be regarded as data in a stationary state.

The acquisition unit 43 obtains the measurement data indicating the state of the engine 11, received by the external I/F unit 20.

The storage unit 44 stores the measurement data obtained by the acquisition unit 43 into the measurement data 31 in association with the measurement condition. It takes time for the engine 11 to respond to a change of the measurement condition. Idle time elapses before measurement data corresponding to the measurement condition is obtained.

The storage unit 44 then identifies a changing parameter that is changing in the measurement condition of the operation instruction output from the output unit 42. The storage unit 44 then stores the measurement data obtained by the acquisition unit 43 into the measurement data 31 in association with the measurement condition of the identified changing parameter the idle time before. FIG. 6 is a diagram for describing the association between the measurement data and the measurement condition. In the example of FIG. 6, the measurement condition is changed from U(1) to U(6) at times 1 to 6. Measurement data X(1) to X(6) is obtained at times 1 to 6. In the example of FIG. 6, an idle time is assumed to be 3. In such a case, the storage unit 44 stores the measurement data in association with the measurement condition three times before (three steps before). In the example of FIGS. 6, U(1) to U(6) and X(4) to X(9) are stored into the measurement data 31 in association with each other. As a result, the measurement data 31 stores measurement data that can be regarded as that of a stationary state for each measurement condition.

Figure 7:
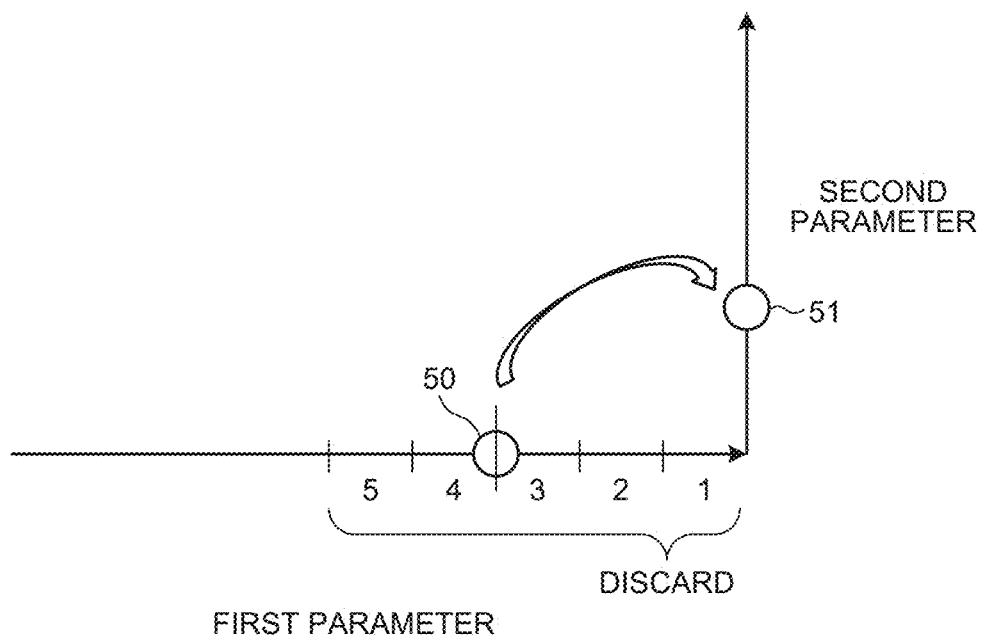
FIG. 7 is a diagram for describing switching of changing parameters.

In the measurement of the present embodiment, the changing parameters of the measurement conditions can be switched during the idle time of one parameter. FIG. 7 is a diagram for describing the switching of changing parameters. FIG. 7 illustrates an example of timing when the changing parameter is switched from a first parameter to a second parameter. Measurement data at timing 50 when the first parameter is changing is obtained at timing 51 after idle time. In the example of FIG. 7, the second parameter is changing at the timing 51. If the changing parameters of the measurement conditions are thus switched during the idle time, the measurement data may be affected by the switching of the changing parameters. If the changing parameters of the measurement conditions are switched, the storage unit 44 then discards the measurement data as much as for the idle time from the switching of the parameters. In the example of FIG. 7, the storage unit 44 discards the measurement data as much as for five measurement cycles, which are the idle time of the first parameter, from the timing when the changing parameters are switched, without storing the measurement data into the measurement data 31. In such a manner, a model can be generated by excluding measurement data that may have been affected by changes in a plurality of parameters. If the storage unit 44 performs such discard of measurement data, the order n of the Hilbert curve is preferably 3 to 5 or so. The reason is that the higher the order of the Hilbert curve is, the more switching points at which to switch changing parameters are and the more the measurement data is discarded.

The model generation unit 45 generates a model of the engine 11. For example, the model generation unit 45 generates a model with respect to each type of measurement data by performing machine learning using the measurement conditions stored in the measurement data 31 and the measurement data corresponding to the measurement conditions. For example, the model generation unit 45 generates a model with respect to each of the concentrations of $NO_x$, PM, and $CO_2$, and gas mileage by using a technique for outputting a weighted average of peripheral data through a regression analysis or the like using a local linear model tree (LOLIMOT) and a Gaussian process. Consequently, the concentrations of $NO_x$, PM, and $CO_2$, and gas mileage under various measurement conditions can be predicted from the generated models.

Figure 8:
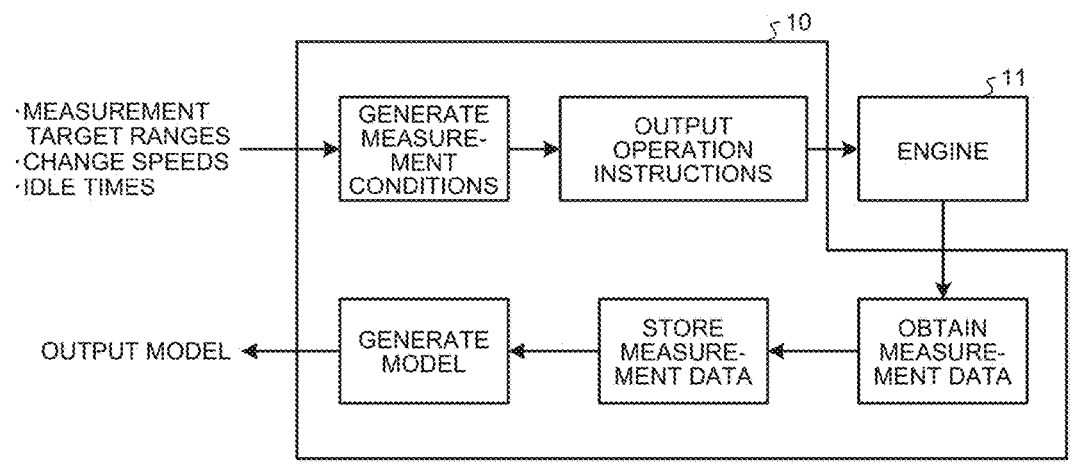
FIG. 8 is a diagram schematically illustrating a flow of generation of a model.

A description will be given by using a specific example. FIG. 8 is a diagram schematically illustrating a flow of generation of a model. In the information processing apparatus 10, the acceptance unit 40 accepts input of the measurement target ranges of the respective parameters for controlling the engine 11, the change speeds of the parameters, and the idle times of the parameters.

The measurement condition generation unit 41 generates a plurality of measurement conditions about the plurality of parameters for controlling the engine 11 in association with predetermined order. For example, the measurement condition generation unit 41 lays out a Hilbert curve in a normalized space in which the measurement target ranges of the respective plurality of parameters are normalized, and generates measurement conditions along a measurement path curve obtained by associating the Hilbert curve with the space. The measurement generation condition unit 41 stores the measurement conditions generated along the measurement path curve into the measurement path information 30 in association with the order along the measurement path curve.

The output unit 42 outputs operation instructions for making the engine 11 operate under the measurement conditions along the order in which the measurement conditions are stored in the measurement path information 30.

The acquisition unit 43 obtains measurement data indicating the state of the engine 11.

The storage unit 44 stores the measurement data obtained by the acquisition unit 43 into the measurement data 31 in association with the measurement conditions. For example, the storage unit 44 identifies the changing parameter changing in the measurement condition of an operation instruction output from the output unit 42. The storage unit 44 then stores the measurement data obtained by the acquisition unit 43 into the measurement data 31 in association with the measurement condition the idle time of the identified changing parameter before. If the changing parameters of the measurement conditions are switched, the storage unit 44 discards the measurement data as much as for the idle time from the switching of the changing parameters.

The model generation unit 45 generates a model with respect to each type of measurement data by performing machine learning using the measurement conditions stored in the measurement data 31 and the measurement data corresponding to the measurement conditions. As a result, measurement data under various measurement conditions becomes predictable from the generated models with respect to each type of measurement data.

In conventional quasi-stationary measurement, measurement data can be obtained only about one parameter. As devices and the like increase, an object to be measured may have a plurality of parameters to control. The use of only one quasi-stationary parameter is thus not able to express correlation with other parameters. For example, with a plurality of parameters, the low speeds for quasi-stationary conditions vary depending on the direction of change. Simultaneously changing a plurality of parameters needs infinite speed settings, which are not practically possible. If a plurality of parameters are simultaneously changed, the idle times also vary depending on the direction of the change. This makes the association corrected for the idle times difficult. By the conventional quasi-stationary measurement, quasi-stationary data about a plurality of parameters is thus difficult to collect. Some parameters may have high nonlinearity. An accurate model is thus difficult to generate from only measurement data with one parameter.

The information processing apparatus 10 according to the present embodiment generates measurement conditions for changing any one of a plurality of parameters for controlling the object to be measured from an immediately previous measurement condition. With the information processing apparatus 10, the change speeds of the parameters and the idle times of the parameters can thus be set easily. The information processing apparatus 10 according to the present embodiment generates measurement conditions that change in a comprehensive manner within the space formed by the measurement target ranges of the respective plurality of parameters for controlling the object to be measured. The information processing apparatus 10 can thus collect sufficient data even in the presence of a parameter or parameters having high nonlinearity, and can generate an accurate model.

Processing Flow

Figure 9:
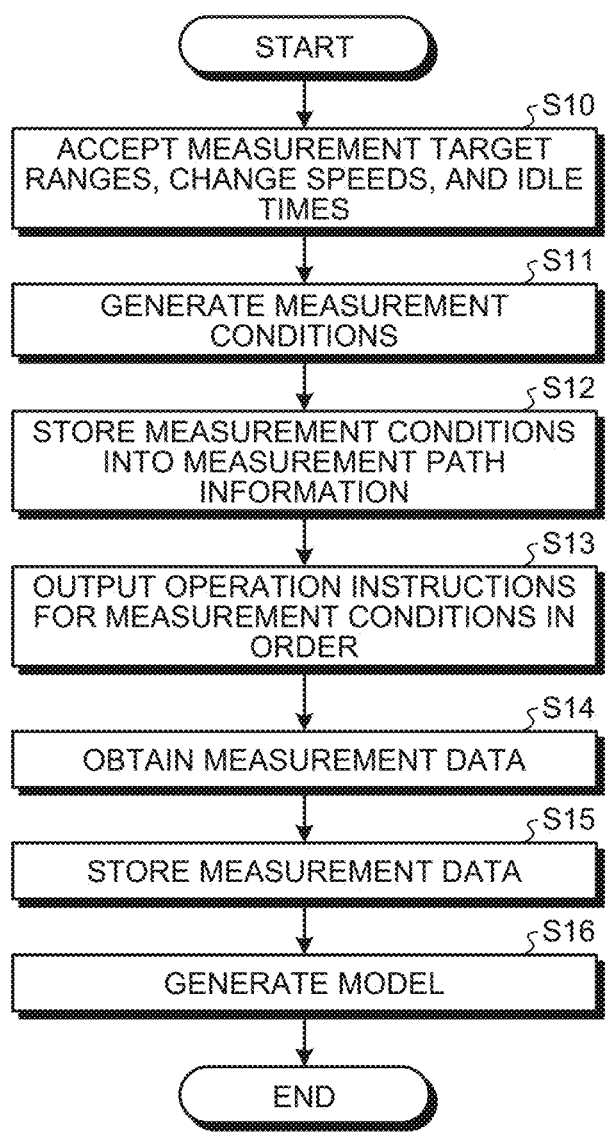
FIG. 9 is a flowchart illustrating an example of a procedure of model generation processing according to the first embodiment.

Next, a flow of model generation processing in which the information processing apparatus 10 according to the present embodiment generates a model will be described. FIG. 9 is a flowchart illustrating an example of a procedure of the model generation processing according to the first embodiment. The model generation processing is performed at predetermined timing, for example, at timing when input of a control instruction for giving instructions to start the generation of a model is accepted from the operation screen.

As illustrated in FIG. 9, the acceptance unit 40 accepts input of the measurement target ranges of the respective parameters for controlling the engine 11, the change speeds of the parameters, and the idle times of the parameters from the operation screen (S10).

The measurement condition generation unit 41 generates a plurality of measurement conditions about the plurality of parameters for controlling the engine 11 in association with predetermined order (S11). For example, the measurement condition generation unit 41 lays out a Hilbert curve in a normalized space in which the measurement target ranges of the respective plurality of parameters are normalized, and generates measurement conditions along a measurement path curve obtained by associating the Hilbert curve with the space. The measurement condition generation unit 41 stores the measurement conditions generated along the measurement path curve into the measurement path information 30 in association with the order along the measurement path curve (S12).

The output unit 42 outputs operation instructions for operating the engine 11 under the measurement conditions according to the order in which the measurement conditions are stored in the measurement path information 30 (S13). The acquisition unit 43 obtains measurement data (S14). The storage unit 44 stores the obtained measurement data into the measurement data 31 in association with the measurement conditions (S15). For example, the storage unit 44 stores the obtained measurement data into the measurement data 31 in association with the measurement condition the idle time of the changing parameter before. If the changing parameters of the measurement conditions are switched, the storage unit 44 discards the measurement data as much as for the idle time from the switching of the changing parameters.

The model generation unit 45 generates a model with respect to each type of measurement data by performing machine learning using the measurement conditions stored in the measurement data 31 and the measurement data corresponding to the measurement conditions (S16), and ends the processing.

Effect

As has been described above, the information processing apparatus 10 according to the present embodiment sequentially makes changes for changing only one of a plurality of control parameters related to control of an object to be measured from an immediately previous measurement point in a space formed by the measurement target ranges of the respective plurality of control parameters. The information processing apparatus 10 thereby generates measurement conditions for performing measurement comprehensive of the space of the measurement target ranges. The information processing apparatus 10 successively outputs operation instructions about the plurality of measurement conditions generated. The information processing apparatuses 10 obtains measurement data indicating the state of the object to be measured of which the control parameters are changed to the measurement conditions by the output operation instructions. As a result, the information processing apparatus 10 can collect quasi-stationary data about the plurality of parameters. In such a manner, the information processing apparatus 10 can generate a model of the object to be measured even if a plurality of parameters are used to control the object to be measured.

The information processing apparatus 10 according to the present embodiment generates the plurality of measurement conditions by using a measurement path curve generated from a Hilbert curve that is laid out in a normalized space in which the measurement target ranges of the respective plurality of control parameters are normalized. The information processing apparatus 10 can thus generate measurement conditions in which only one of the plurality of control parameters changes from an immediately previous measurement point, the measurement conditions changing in a comprehensive manner within the space formed by the measurement target ranges of the respective plurality of control parameters.

The information processing apparatus 10 according to the present embodiment accepts an idle time to elapse before measurement data corresponding to a measurement condition is obtained. The information processing apparatus 10 stores the obtained measurement data in association with the measurement condition the idle time before. In such a manner, the information processing apparatus 10 can associate the measurement condition with quasi-stationary measurement data corresponding to the measurement condition.

If the control parameters of the measurement conditions to change are switched, the information processing apparatus 10 according to the present embodiment discards the measurement data as much as for the idle time. In such a manner, the information processing apparatus 10 can exclude measurement data that may have been affected by changes in a plurality of control parameters.

The information processing apparatus 10 according to the present embodiment moves a point on a space-filling curve along the space-filling curve, the space-filling curve being constructed on the computer with the plurality of control parameters related to the control of the object to be measured as respective variables. Each time the point is moved, the information processing apparatus 10 obtains measurement data indicating the state of the object to be measured when the object to be measured is controlled on the basis of the values of the plurality of control parameters corresponding to the moved point. The information processing apparatus 10 generates a control model of the object to be measured on the basis of a plurality of pieces of measurement data obtained. In such a manner, the information processing apparatus 10 can generate the model of the object to be measured even if a plurality of parameters are used to control the object to be measured.

[b] Second Embodiment

Next, a second embodiment will be described. The second embodiment deals with a case where measurement data to be used to generate a model is changed to improve prediction accuracy according to the purpose of optimization. A system 1 and an information processing apparatus 10 according to the second embodiment have substantially the same configuration as that of the system 1 and the information processing apparatus 10 according to the first embodiment illustrated in FIGS. 1 and 2. Differences will be mainly described below.

The acquisition unit 43 obtains measurement data to be used to generate a model according to the purpose of optimization. For example, the acquisition unit 43 increases measurement points in a specific area of a measurement target range as compared to the areas other than the specific area, and obtains measurement data at the measurement points.

Figure 10A:
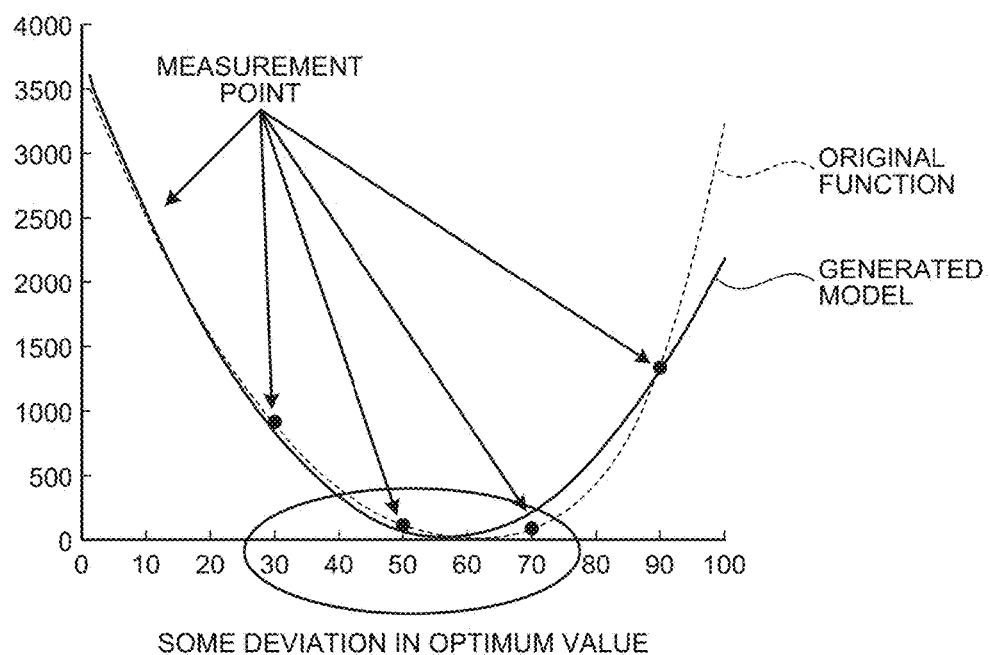
FIG. 10A is a diagram illustrating an example of a model.

An example of a change of a model depending on the density of measurement points will be described. FIG. 10A is a diagram illustrating an example of a model. The example of FIG. 10A illustrates an approximate function determined as a model from measurement data at uniformly-measured measurement points. In generating a model, pieces of measurement data on respective measurement points are typically equally evaluated. The example of FIG. 10A has small errors on the whole. Since the pieces of measurement data on the measurement points are equally evaluated, there are some deviations near the minimum value.

Figure 10B:
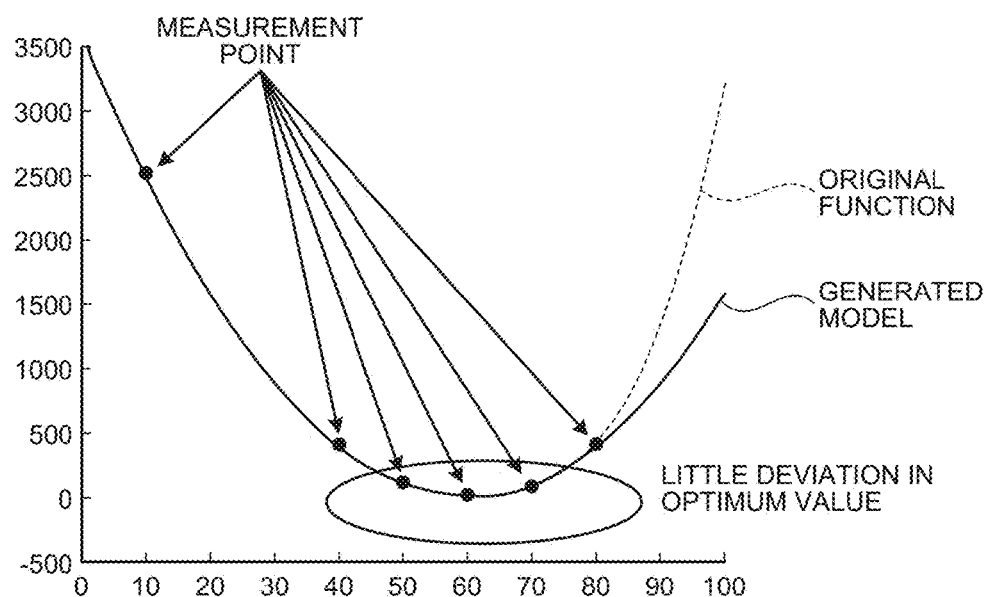
FIG. 10B is a diagram illustrating an example of a model.

FIG. 10B is a diagram illustrating an example of a model. The example of FIG. 10B illustrates an approximate function determined as a model from measurement data on measurement points, the measurement points being more in number near the minimum value as compared to other than near the minimum value. In the example of FIG. 10B, there is little deviation near the minimum value, whereas there is a large error other than near the minimum value. In generating a model, the pieces of measurement data on the respective measurement points are equally evaluated. The density of the measurement points is then adjusted to increase the accuracy of the model in the portion where the density of the measurement points is high. For optimization calculation, the density of the measurement points in a specific area is adjusted so that the model has high accuracy in the specific area.

In control design, to determine optimum control, it is sometimes preferred to generate a model that is accurate in a specific area of a measurement target range than to generate a model that has less errors with respect to the entire measurement target range. Take, for example, the case of suppressing the $NO_x$ content in the exhaust gas of the engine 11. For the control design, $NO_x$ is measured as measurement data. The measurement points near the minimum value of $NO_x$ are preferably increased as compared to other than near the minimum value to generate a model having high accuracy near the minimum value.

Quasi-stationary measurement includes changing the setting value of a parameter at speed such that the parameter can be regarded as being stationary. As a result, hysteresis occurs in which measurement data measured at each measurement point is affected by the previous measurement point. As illustrated in FIGS. 3 to 5, most of the portions of a Hilbert curve have reversely-changing portions nearby. If, for example, a model is generated by using all the measurement points of the measurement data 31 like the first embodiment, such hysteresis effects are substantially cancelled out by the presence of similar measurement points in reversely-changing portions.

Figure 11A:
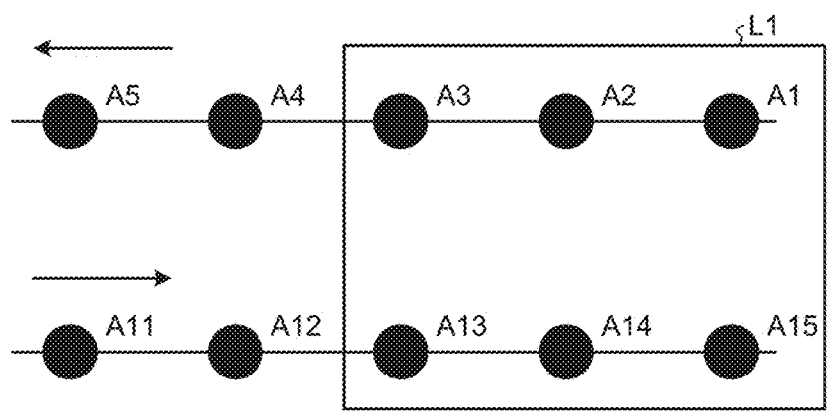
FIG. 11A is a diagram illustrating an example of measurement points used to generate a model.

FIG. 11A is a diagram illustrating an example of measurement points used to generate a model. In the example of FIG. 11A, measurement points A1 to A5 and measurement points A11 and A15 are portions in which a parameter changes in opposite directions. Suppose that the measurement points A1 to A5 have an upward hysteresis in the measurement data, and the measurement points A11 to A15 have a downward hysteresis in the measurement data. If a model is generated by using the measurement data on the measurement points A1 to A5 and A11 to A15, the hysteresis effects are substantially cancelled out. For example, in the example of FIG. 11A, the portion enclosed by the line L1 includes the same numbers of measurement points A1 to A3 and measurement points A13 and A15 where the parameter changes in opposite directions. Since the hysteresis effects are substantially cancelled out, the hysteresis effects on the generated model are suppressed to be small.

Figure 11B:
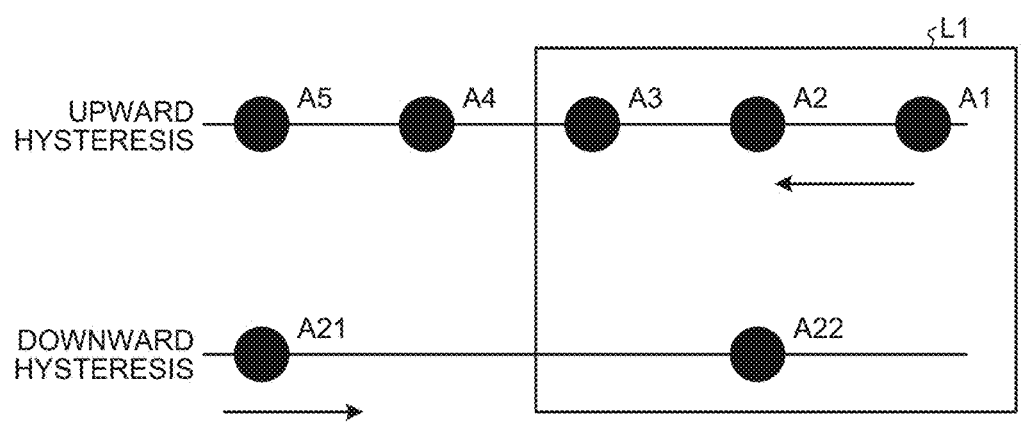
FIG. 11B is a diagram illustrating an example of measurement points used to generate a model.

FIG. 11B is a diagram illustrating an example of measurement points used to generate a model. In the example of FIG. 11B, measurement points A1 to A5 and measurement points A21 and A22 are portions where a parameter changes in opposite directions. Suppose that the measurement points A1 to A5 have an upward hysteresis in the measurement data, and the measurement points A21 and A22 have a downward hysteresis in the measurement data. If a model is generated by using the measurement data on the measurement points A1 to A5, A21, and A22, the effect of an upward hysteresis remains. For example, in the example of FIG. 11B, the portion enclosed by the line L1 includes more measurement points A1 to A3 with an upward hysteresis than the measurement point A22 with a downward hysteresis. If there is a large difference between the numbers of measurement points lying on two sides where the parameter changes in opposite directions, the prediction accuracy of the generated model decreases. In the case of the example of FIG. 11B, the generated model is affected by an upward hysteresis, and the prediction accuracy of the model decreases.

The acquisition unit 43 obtains measurement data on more measurement points in a specific area of the measurement target ranges than in the areas other than the specific area. The acquisition unit 43 obtains measurement data on measurement points, the numbers of measurement points lying on two sides in each group of two adjacent sides of the measurement path curve where a control parameter changes in opposite directions being balanced. For example, the acquisition unit 43 obtains measurement data on measurement points on two opposed sides of the measurement path curve where a control parameter changes in opposite directions, the width of the two sides corresponding to a width at which changing parameters are switched, the numbers of measurement points on the two sides being balanced. For example, the acquisition unit 43 divides the measurement path curve into groups of two adjacent sides where a parameter changes in opposite directions. For example, the acquisition unit 43 divides sides of the measurement path curve into groups each including two closest sides where a parameter changes in opposite directions. If there are a plurality of sides that are closest to a side of the measurement path curve and where a parameter changes in an opposite direction, the acquisition unit 43 assigns numbers to the sides along the measurement path curve. The acquisition unit 43 then groups a side of the measurement path curve with a side having the smallest number among the sides that are closest to the side and where a parameter changes in an opposite direction. The acquisition unit 43 further divides the measurement path curve into groups each including a side that does not have an adjacent side where a parameter changes in an opposite direction.

Figure 12:
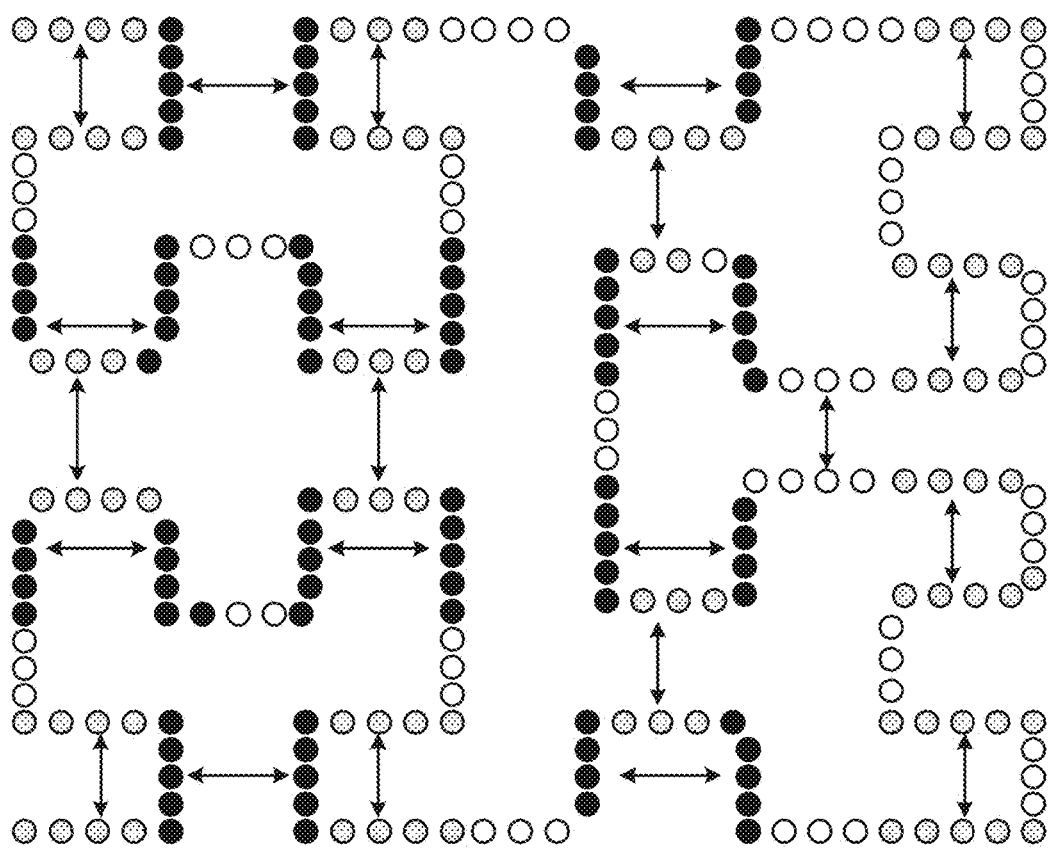
FIG. 12 is a diagram illustrating an example of grouping of a measurement path curve.

FIG. 12 is a diagram illustrating an example of grouping of the measurement path curve. In the example of FIG. 12, groups of two adjacent sides of the measurement path curve where a parameter changes in opposite directions are indicated by arrows.

The acquisition unit 43 determines an average of the measurement data at the measurement points on the sides belonging to each group. For example, if a group includes two adjacent sides where a parameter changes in opposite directions, the acquisition unit 43 determines an average of the measurement data at the measurement points on the two sides. If a group includes one side without an adjacent side where a parameter changes in an opposite direction, the acquisition unit 43 determines an average of the measurement data at the measurement points on the side.

The acquisition unit 43 determines a thinning width of each group according to the average. The acquisition unit 43 then thins out measurement points on the side(s) belonging to each group with the determined thinning width. The acquisition unit 43 thereby extracts measurement data on the measurement points from the measurement data 31.

A technique for determining the thinning width will be described. In the case of an optimization problem for minimization, the acquisition unit 43 reduces the thinning width as the measurement data decreases. The acquisition unit 43 thereby obtains measurement data on more measurement points as the measurement data decreases. In the case of an optimization problem for maximization, the acquisition unit 43 reduces the thinning width as the measurement data increases. The acquisition unit 43 thereby obtains measurement data on more measurement points as the measurement data increases. In the case of an optimization problem to put an emphasis on the vicinity of a predetermined value, the acquisition unit 43 reduces the thinning width as a difference of the measurement data to the predetermined value decreases. The acquisition unit 43 thereby obtains measurement data on more measurement points as a difference of the measurement data to the predetermined value decreases.

For example, suppose that an average of measurement data of group i is Si. A minimum value p of the average Si of each group can be expressed by the following Eq. (5). A maximum value q of the average Si of each group can be expressed by the following Eq. (6). Suppose that a minimum thinning width is k, and a maximum thinning width is m. The minimum thinning width k and the maximum thinning width m may be determined in advance. The acceptance unit 40 may display an operation screen related to the control design, and accept input of the minimum thinning width k and the maximum thinning width m.

$$p=\min(Si) \quad (5)$$

$$q=\max(Si) \quad (6)$$

In the case of an optimization problem for minimization, the acquisition unit 43 determines a thinning width CB of group i by the following Eq. (7).

$$CB=\mathrm{floor}(((Si-p)\times(m-k))/(q-p))+k \quad (7)$$

where floor ( ) is a calculation for determining the value of the integer portion in ( ).

In the case of an optimization problem for maximization, the acquisition unit 43 determines the thinning width CB of group i by the following Eq. (8).

$$CB=\mathrm{floor}(((q-Si)\times(m-k))/(q-p))+k \quad (8)$$

In the case of an optimization problem to put an emphasis on the vicinity of a predetermined value a, the acquisition unit 43 determines a value Si' of the differences between the measurement data and the predetermined value a in each group. The value Si' may be an average of the squares of differences between the measurement data and the predetermined value a in each group. The value Si' may be an average of the squares of the differences between the averages of the measurement data and the predetermined value. The value Si' may be an average of the absolute values of the differences. The value Si' may be a differences between the average of the measurement data and the predetermined. A minimum value P of the value Si' of each group can be expressed by the following Eq. (9). A maximum value Q of the value Si' of each group can be expressed by the following Eq. (10).

$$P=\min(Si') \quad (9)$$

$$Q=\max(Si') \quad (10)$$

In the case of an optimization problem to put an emphasis on the vicinity of a predetermined value a, the acquisition unit 43 determines the thinning width CB of group i by the following Eq. (11).

$$CB=\mathrm{floor}(((Si'-P)\times(m-k))/(Q-P))+k \quad (11)$$

The acquisition unit 43 thins out the measurement points on the sides belonging to each group with the determined thinning width to obtain measurement data on the measurement points from the measurement data 31.

Figure 13:
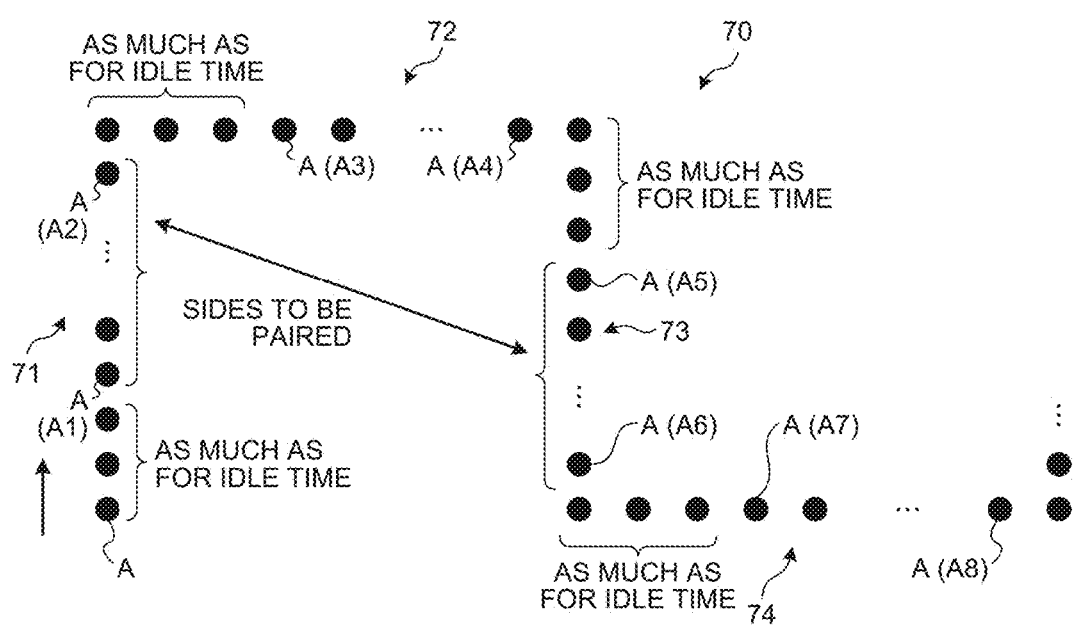
FIG. 13 is a diagram illustrating an example of a measurement path curve.

A description will be given by using a specific example. FIG. 13 is a diagram illustrating an example of the measurement path curve. FIG. 13 illustrates part of a measurement path curve 70. In quasi-stationary measurement, measurement data indicating the state of the engine 11 is obtained by changing the setting value of any one of the parameters along the measurement path curve 70 at speed such that the parameter can be regarded as being stationary. The measurement path curve 70 is divided into sides depending on the parameter to change. The measurement path curve 70 includes sides 71 to 74. FIG. 13 illustrates measurement points A at which measurement data is obtained on the sides 71 to 74. The sides 71 and 73 belong to the same group because the sides 71 and 73 are adjacent to each other and a parameter changes in opposite directions. The sides 72 and 74 have no adjacent side where a parameter changes in an opposite direction. The sides 72 and 74 thus constitute respective groups by themselves.

The acquisition unit 43 obtains measurement data indicating the state of the engine 11 at each measurement point A from the not-illustrated control apparatus controlling the engine 11 via the external I/F unit 20.

The storage unit 44 stores the measurement data obtained by the acquisition unit 43 into the measurement data 31 in association with the measurement condition. If the parameters of the measurement conditions to change are switched, the storage unit 44 discards the measurement data as much as for the idle time from the switching of the parameters. In FIG. 13, the measurement data on the measurement points A as much as for the idle times on the sides 71 to 74 is discarded.

An average of the measurement data on measurement points A1 to A2 and A5 to A6 on the sides 71 and 73 will be denoted by S1. An average of the measurement data on measurement points A3 to A4 on the side 72 will be denoted by S2. An average of the measurement data on measurement points A7 to A8 on the side 74 will be denoted by S3.

Suppose, for example, that S1=15, S2=10, and S3=20. The minimum value p of the average Si of each group is p=10. The maximum value q of the average Si of the each group is q=20. The thinning width ranges between 2 and 10 (k=2 and m=10).

For example, in the case of an optimization problem for minimization, a thinning width CB1 of the group of the sides 71 and 73 is determined, from the foregoing Eq. (7), as follows:

$$\begin{aligned} CB1 &= \mathrm{floor}\,(((S1-p)\times(m-k))/(q-p))+k \\ &= \mathrm{floor}\,(((15-10)\times(10-2))/(20-10))+2 \\ &= \mathrm{floor}\,(4)+2 \\ &= 6 \end{aligned}$$

Similarly, from the foregoing Eq. (7), a thinning width CB2 of the group of the side 72 is determined as follows:

$$\begin{aligned} CB2 &= \mathrm{floor}\,(((S2-p)\times(m-k))/(q-p))+k \\ &= \mathrm{floor}\,(((10-10)\times(10-2))/(20-10))+2 \\ &= \mathrm{floor}\,(0)+2 \\ &= 2 \end{aligned}$$

Similarly, from the foregoing Eq. (7), a thinning width CB3 of the group of the side 74 is determined as follows:

$$\begin{aligned} CB3 &= \mathrm{floor}\,(((S3-p)\times(m-k))/(q-p))+k \\ &= \mathrm{floor}\,(((20-10)\times(10-2))/(20-10))+2 \\ &= \mathrm{floor}\,(8)+2 \\ &= 10 \end{aligned}$$

The acquisition unit 43 reads the measurement data on the sides 71 and 73 from the measurement data 31 at every six measurement points. The acquisition unit 43 reads the measurement data on the side 72 from the measurement data 31 at every two measurement points. The acquisition unit 43 reads the measurement data on the side 74 from the measurement data 31 at every ten measurement points.

The model generation unit 45 generates a model by performing machine learning using the measurement data on the measurement points read by the acquisition unit 43. The acquisition unit 43 may store the read measurement data on the measurement points into the memory unit 23. The model generation unit 45 may generate a model from the measurement data on the measurement points stored in the memory unit 23.

As a result of the thinning, the numbers of measurement points used to generate a model on the sides 71 and 73 become 1/6. The number of measurement points used to generate a model on the side 72 becomes 1/2. The number of measurement points used to generate a model on the side 74 becomes 1/10. This increases the prediction accuracy of the generated model near the side 72 where the average value Si is small. The measurement points on the sides 71 and 73 are thinned out in number by the same thinning width. The numbers of measurement points lying on the two sides are thereby balanced to substantially cancel out the hysteresis effects. As a result, the prediction accuracy of the generated model improves.

Suppose, for example, that S1=15, S2=10, and S3=20. The predetermined value a to put an emphasis on is a=16, for example. The value S1' of the difference between the average S1 of the measurement data on the sides 71 and 73 and the predetermined value a is determined by the following Eq. (12). The value S2' of the difference between the average S2 of the measurement data on the side 72 and the predetermined value a is determined by the following Eq. (13). The value S3' of the difference between the average S3 of the measurement data on the side 74 and the predetermined value a is determined by the following Eq. (14).

$$S1'=(S1-16)^2=1 \quad (12)$$

$$S2'=(S2-16)^2=36 \quad (13)$$

$$S3'=(S3-16)^2=16 \quad (14)$$

Suppose that the minimum value P of the value Si' of each group is P=1, and the maximum value Q of the value Si' of each group is Q=36. The thinning width ranges between 2 to 10 (k=2 and m=10).

In the case of an optimization problem to put an emphasis on the predetermined value a=16, the thinning width CB1 of the group of the sides 71 and 73 is determined, from the foregoing Eq. (11), as follows:

$$\begin{aligned}CB1 &= \text{floor}\,(((S1'-P)\times(m-k))/(Q-P))+k \\ &= \text{floor}\,(((1-1)\times(10-2))/(36-1))+2 \\ &= \text{floor}\,(0)+2 \\ &= 2\end{aligned}$$

Similarly, from the foregoing Eq. (11), the thinning width CB2 of the group of the side 72 is determined as follows:

$$\begin{aligned}CB2 &= \text{floor}\,(((S2'-P)\times(m-k))/(Q-P))+k \\ &= \text{floor}\,(((36-1)\times(10-2))/(36-1))+2 \\ &= \text{floor}\,(8)+2 \\ &= 10\end{aligned}$$

Similarly, from the foregoing Eq. (11), the thinning width CB3 of the group of the side 74 is determined as follows:

$$\begin{aligned}CB3 &= \text{floor}\,(((S3'-P)\times(m-k))/(Q-P))+k \\ &= \text{floor}\,(((16-1)\times(10-2))/(36-1))+2 \\ &= \text{floor}\,(1.9)+2 \\ &= 3\end{aligned}$$

The acquisition unit 43 reads the measurement data on the sides 71 and 73 from the measurement data 31 at every two measurement points. The acquisition unit 43 reads the measurement data on the side 72 from the measurement data 31 at every ten measurement points. The acquisition unit 43 reads the measurement data on the side 74 from the measurement data 31 at every 46 measurement points.

The model generation unit 45 generates a model by performing machine learning using the measurement data on the measurement points read by the acquisition unit 43.

As a result of the thinning, the numbers of measurement points used to generate a model on the sides 71 and 73 become 1/2. The number of measurement points used to generate a model on the side 72 becomes 1/10. The number of measurement points used to generate a model on the side 74 becomes 1/46. Consequently, the prediction accuracy of the generated model increases near the sides 71 and 73 where the average Si is close to the predetermined value a (=16). The measurement points on the sides 71 and 73 are thinned out in number with the same thinning width. The numbers of measurement points lying on the two sides are thus balanced to substantially cancel out the hysteresis effects. As a result, the prediction accuracy of the generated model improves.

The acquisition unit 43 may obtain measurement data on two adjacent sides where a parameter changes in opposite directions so that a difference between the numbers of measurement points lying on the two sides is at most one or less. For example, if the measurement points on two adjacent sides where a parameter changes in opposite directions are thinned by a determined thinning width, the resulting number of measurement points on one side may be two or more greater than on the other side. In such a case, the acquisition unit 43 further thins out the measurement points on the one side so that a difference between the numbers of measurement points is at most one or less. The measurement point(s) to be thinned is/are preferably selected from a start portion or end portion of the side. For example, the acquisition unit 43 reads measurement data on measurement points on one side from the measurement data 31 at intervals of the number of measurement points of the determined thinning width. If the number of measurement points read on the one side reaches the number of measurement points read on the other side, the acquisition unit 43 ends reading the measurement data on the measurement points on the one side. In such a manner, the numbers of measurement points lying on the two sides are made almost equal to substantially cancel out the hysteresis effects. As a result, the prediction accuracy of the generated model improves.

Processing Flow

Figure 14:
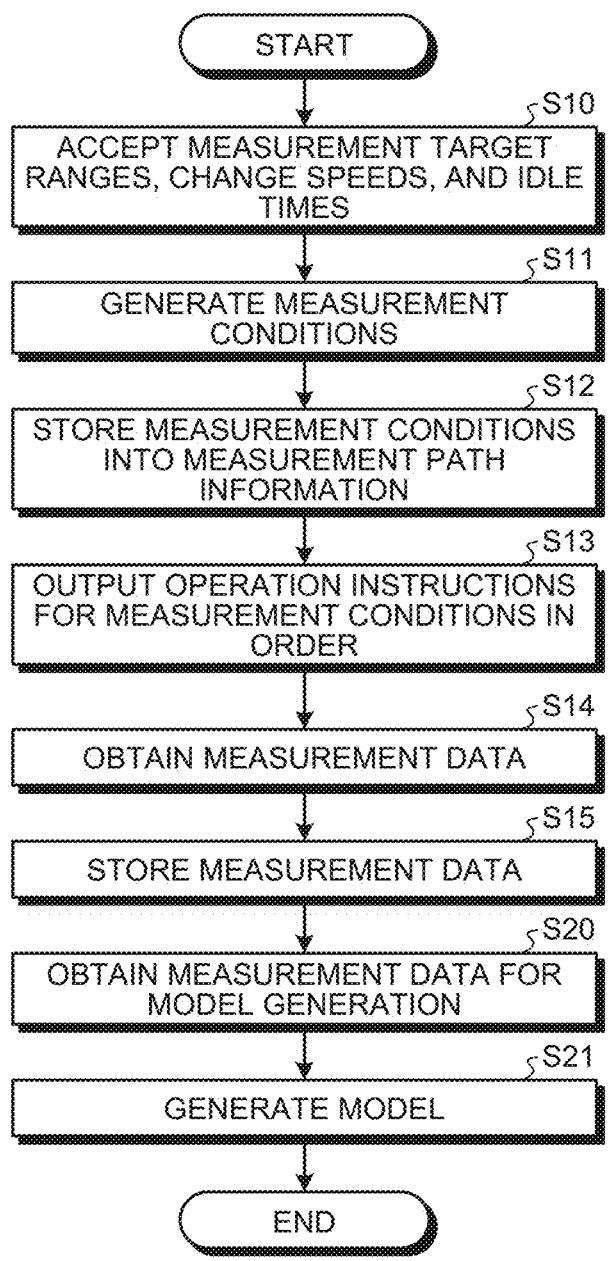
FIG. 14 is a flowchart illustrating an example of a procedure of model generation processing according to a second embodiment.

Next, a flow of model generation processing in which the information processing apparatus 10 according to the present embodiment generates a model will be described. FIG. 14 is a flowchart illustrating an example of a procedure of the model generation processing according to the second embodiment. The model generation processing according to the second embodiment is in part the same as the model generation processing according to the first embodiment illustrated in FIG. 9. Like parts will be designated by the same reference numerals. Differences will be mainly described below.

The acquisition unit 43 obtains measurement data for model generation from the measurement data 31 (S20). For example, the acquisition unit 43 divides the measurement path curve into groups each including two adjacent sides where a parameter changes in opposite directions. The acquisition unit 43 also divides the measurement path curve into groups each including a side having no adjacent side where a parameter moves in an opposite direction. The acquisition unit 43 determines an average of measurement data on measurement points on the side or sides belonging to each group. The acquisition unit 43 determines a thinning width of each group according to the average. The acquisition unit 43 thins out the measurement points on the side(s) belonging to each group with the determined thinning width to obtain measurement data on the measurement points from the measurement data 31.

The model generation unit 45 generates a model by performing machine learning using the measurement data on the measurement points obtained in S20 (S21), and ends the processing.

Effect

As described above, the information processing apparatus 10 according to the present embodiment obtains measurement data on measurement points sequentially measured along a measurement path curve, the measurement points being more in number in a specific area of the measurement target ranges than in the areas other than the specific area, the numbers of measurement points lying on two sides in each group of two adjacent sides of the measurement path curve where a control parameter changes in opposite directions being balanced. The information processing apparatus 10 generates a control model of the object to be measured on the basis of the obtained measurement data on the measurement points. The information processing apparatus 10 can thus improve the prediction accuracy of the model.

The information processing apparatus 10 according to the present embodiment obtains the measurement data on the measurement points on two sides in each group of two adjacent sides of the measurement path curve where a control parameter changes in opposite directions, so that a difference between the numbers of measurement points lying on the two sides is at most one or less. In such a manner, the information processing apparatus 10 makes the numbers of measurement points lying on the two sides almost equal to substantially cancel out hysteresis effects. As a result, the prediction accuracy of the generated model improves.

The information processing apparatus 10 according to the present embodiment extracts measurement data at shorter intervals in the specific area than in the areas other than the specific area from the measurement data that is sequentially measured by changing a control parameter along the measurement path curve at speed such that the control parameter can be regarded as being stationary. Consequently, the information processing apparatus 10 can generate a control model having high prediction accuracy in the specific area.

In the case of an optimization problem for miniaturization, the information processing apparatus 10 according to the present embodiment obtains measurement data on more measurement points as the measurement data decreases. In the case of an optimization problem for maximization, the information processing apparatus 10 obtains measurement data on more measurement points as the measurement data increases. In such a manner, the information processing apparatus 10 can generate a control model that can accurately predict a minimum value of the measurement data in the case of an optimization problem for minimization, and a maximum value of the measurement data in the case of an optimization problem for maximization.

In the case of an optimization problem to put an emphasis on the vicinity of a predetermined value, the information processing apparatus 10 according to the present embodiment obtains measurement data on more measurement points as a difference of the measurement data to the predetermined value decreases. In such a manner, the information processing apparatus 10 can generate a control model that can accurately predict the vicinity of the predetermined value of the measurement data in the case of an optimization problem to put an emphasis on the vicinity of the predetermined value.

[c] Third Embodiment

Next, a third embodiment will be described. The third embodiment deals with a case of changing the measurement intervals during quasi-stationary measurement to obtain measurement data at higher density in a specific area than in areas other than the specific area. A system 1 and an information processing apparatus 10 according to the third embodiment have substantially the same configuration as that of the system 1 and the information processing apparatus 10 according to the first embodiment illustrated in FIGS. 1 and 2. Differences will be mainly described below.

The output unit 42 outputs an operation instruction specifying a measurement condition from the external I/F unit 20 to the not-illustrated control apparatus that controls the engine 11. For example, the output unit 42 outputs an operation instruction for operating the engine 11 under a measurement condition according to order in which measurement conditions are stored in the measurement path information 30. A parameter of the engine 11 is changed to the measurement condition, and the engine 11 operates under the measurement condition. According to the operation instruction, any one of the parameters of the engine 11 changes at low speed such that the parameter can be regarded as being stationary. In other words, the output unit 42 performs quasi-stationary measurement of the engine 11.

The acquisition unit 43 outputs a measurement instruction about the state of the engine 11 from the external I/F unit 20 to the not-illustrated control apparatus that controls the engine 11. Receiving the measurement instruction, the control apparatus measures the state of the engine 11, and outputs data indicating the measured state of the engine 11 as measurement data in association with measurement time. More specifically, each time the control apparatus receives a measurement instruction, the control apparatus measures the state of the engine 11 and outputs the measurement data. The acquisition unit 43 obtains the measurement data output from the control apparatus via the external I/F unit 20.

The acquisition unit 43 adjusts the timing at which to output measurement instructions while the output unit 42 is performing quasi-stationary measurement of the engine 11.

The acquisition unit 43 thereby obtains measurement data at higher density in the specific area than in the areas other than the specific area.

A flow of the acquisition of measurement data will be described in detail. For example, the acquisition unit 43 divides the measurement path curve into groups each including two adjacent sides where a parameter changes in opposite directions. The acquisition unit 43 also divides the measurement path curve into groups each including a side having no adjacent side where a parameter changes in an opposite direction. The acquisition unit 43 obtains the settings of the parameters used for control. For example, the acquisition unit 43 obtains the settings of idle times of which input is accepted by the acceptance unit 40.

In the third embodiment, the exact minimum value p and maximum value q of the average Si of each group and the exact minimum value P and maximum value Q of the value Si' of each group are unknown because quasi-stationary measurement is in process. However, for example, the user can predict a minimum value p, maximum value q, minimum value P, and maximum value Q from the same kind of experimental results and experiences in the past. The acceptance unit 40 then displays an operation screen about the control design, and accepts input of the minimum value p, maximum value q, minimum value P, and maximum value Q. The acquisition unit 43 obtains the settings of the minimum value p, maximum value q, minimum value P, and maximum value Q of which the input is accepted by the acceptance unit 40.

The output unit 42 outputs operation instructions for making the engine 11 operate under measurement conditions according to the order in which the measurement conditions are stored in the measurement path information 30, and performs quasi-stationary measurement of the engine 11. The acquisition unit 43 obtains measurement data while the output unit 42 is performing quasi-stationary measurement of the engine 11.

Figure 15:
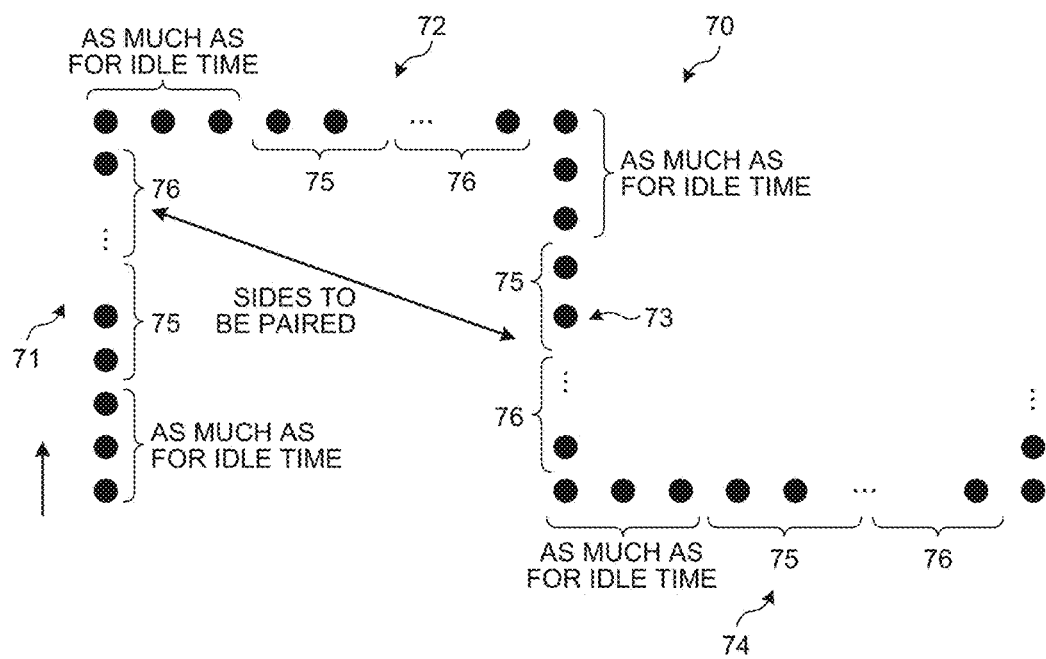
FIG. 15 is a diagram for describing a flow of acquisition of measurement data during quasi-stationary measurement.

FIG. 15 is a diagram for describing the flow of the acquisition of measurement data during quasi-stationary measurement. FIG. 15 illustrates part of the measurement path curve 70. The output unit 42 outputs operation instructions for operating the engine 11 under the measurement conditions along the measurement path curve 70, and performs quasi-stationary measurement of the engine 11. If the parameters of the measurement conditions to change in the quasi-stationary measurement are switched, the acquisition unit 43 determines whether the side under measurement where a parameter is changing is one having no adjacent side where the parameter changes in an opposite direction. The sides 72 and 74 of FIG. 15 each are a side having no adjacent side where the parameter changes in an opposite direction. If the side under measurement is one having no adjacent side where the parameter changes in an opposite direction, the acquisition unit 43 waits until the idle time elapses after the switching of the changing parameters. If the idle time has elapsed, the acquisition unit 43 outputs measurement instructions at measurement cycles for a predetermined period to obtain measurement data about an initial portion 75 of the side under measurement. The predetermined period may be determined in advance. The predetermined period may be about twice to three times the idle time. The predetermined period may be able to be set by the user. The acquisition unit 43 determines an average of the measurement data obtained from the initial portion 75 of the side under measurement, and determines a thinning width according to the average. For example, in the case of an optimization problem for minimization, the acquisition unit 43 calculates the thinning width from the foregoing Eq. (7). In the case of an optimization problem to put an emphasis on the vicinity of a predetermined value, the acquisition unit 43 determines a value Si' of the differences between the measurement data and the predetermined value. The acquisition unit 43 then calculates the thinning width from the foregoing Eq. (11). The acquisition unit 43 outputs measurement instructions for the remaining portion of the side under measurement at timing according to the thinning width. For example, the acquisition unit 43 outputs measurement instructions for a remaining portion 76 of the side under measurement at cycles obtained by multiplying the measurement cycle by the value of the thinning width. The acquisition unit 43 thereby obtains measurement data according to the thinning width. For example, if the value of the thinning width is 2, the measurement intervals of the measurement points at which measurement data is obtained become twice. The storage unit 44 stores the measurement data obtained by the acquisition unit 43 into the measurement data 31 in association with the measurement condition. The acquisition unit 43 thins out the measurement data obtained from the initial portion 75 of the side under measurement with the thinning width, and obtains measurement data on measurement points at the measurement intervals according to the thinning width. The storage unit 44 stores the measurement data obtained by the acquisition unit 43 into the measurement data 31 in association with the measurement condition.

If the side under measurement is not one having no adjacent side where a parameter changes in an opposite direction, the side under measurement is one of two adjacent sides where a parameter changes in opposite directions. The acquisition unit 43 determines whether the thinning width of the other side belonging to the same group as the side under measurement does has been determined. If the thinning width of the other side has not been determined, the acquisition unit 43 calculates the thinning width from the initial portion 75 of the side under measurement and obtains measurement data according to the thinning width as is the case with one side having no adjacent side where a parameter changes in an opposite direction. The storage unit 44 stores the measurement data obtained by the acquisition unit 43 into the measurement data 31 in association with the measurement condition.

If the thinning width of the other side has been determined, the acquisition unit 43 waits until the idle time elapses after the switching of the changing parameters. The acquisition unit 43 then outputs measurement instructions for the side under measurement from the initial portion 75 to the end at timing according to the thinning width determined of the other side, and obtains measurement data according to the thinning width. The storage unit 44 stores the measurement data obtained by the acquisition unit 43 into the measurement data 31 in association with the measurement condition.

In such a manner, in the third embodiment, measurement data is obtained at higher density in a specific area than in areas other than the specific area while quasi-stationary measurement is performed.

The model generation unit 45 generates a model with respect to each type of measurement data by performing machine learning using the measurement conditions stored in the measurement data 31 and the measurement data corresponding to the measurement conditions. The generated model thus has high prediction accuracy in the specific area. Measurement points on two adjacent sides where a parameter changes in opposite directions are thinned out in number with the same thinning width. The numbers of measurement points lying on the two sides are balanced to substantially cancel out hysteresis effects. As a result, the prediction accuracy of the generate model improves.

Figure 16:
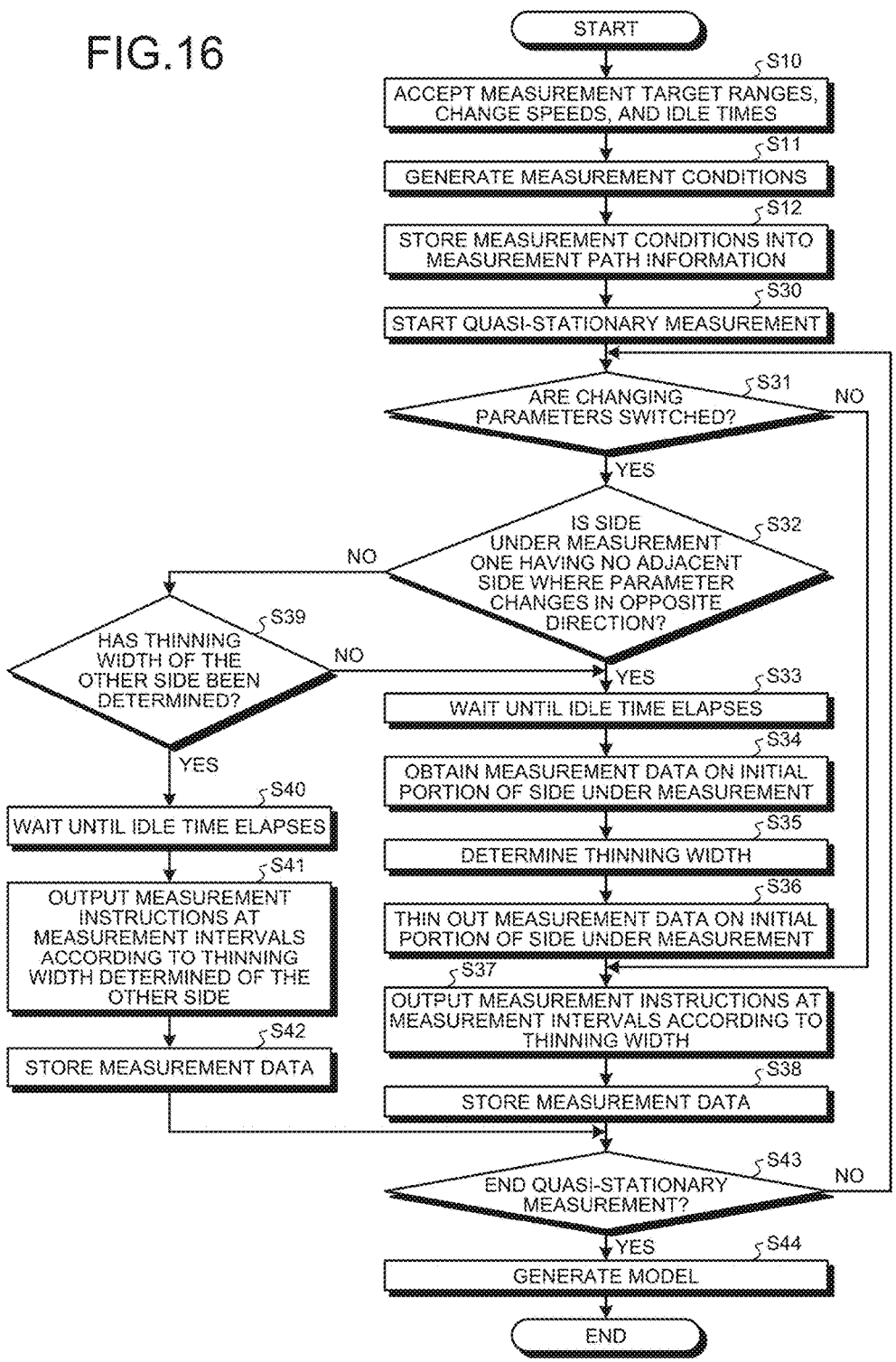
FIG. 16 is a flowchart illustrating an example of a procedure of model generation processing according to a third embodiment.

Next, a flow of model generation processing in which the information processing apparatus 10 according to the present embodiment generates a model will be described. FIG. 16 is a flowchart illustrating an example of a procedure of the model generation processing according to the third embodiment. The model generation processing according to the third embodiment is in part the same as the model generation processing according to the first embodiment illustrated in FIG. 9. Like parts will be designated by the same reference numerals. Differences will be mainly described below.

The output unit 42 successively outputs operation instructions for operating the engine 11 under measurement conditions along the order in which the measurement conditions are stored in the measurement path information 30, and starts quasi-stationary measurement of the engine 11 (S30).

The acquisition unit 43 determines whether the parameters of the measurement conditions to change are switched during the quasi-stationary measurement (S31). If the parameters to change are not switched (No in S31), the processing proceeds to S37 to be described later.

If the parameters to change are switched (Yes in S31), the acquisition unit 43 determines whether the side under measurement is a side having no adjacent side where a parameter changes in an opposite direction (S32). If the side under measurement is one having no adjacent side where a parameter changes in an opposite direction (Yes in S32), the acquisition unit 43 waits until the idle time elapses after the switching of the changing parameters (S33). The acquisition unit 43 outputs measurement instructions at measurement cycles for a predetermined period to obtain measurement data about the initial portion 75 of the side under measurement (S34). The acquisition unit 43 determines an average of the measurement data obtained from the initial portion 75 of the side under measurement, and determines a thinning width according to the average (S35). The acquisition unit 43 thins out the measurement data obtained from the initial portion 75 of the side under measurement with the determined thinning width to obtain measurement data on measurement points at measurement intervals according to the thinning width (S36). The acquisition unit 43 outputs measurement instructions at timing according to the determined thinning width, and obtains measurement data according to the thinning width (S37). If the thinning width has not been determined, the acquisition unit 43 performs the processing with a predetermined initial value (for example, 1) as the thinning width. The storage unit 44 stores the measurement data obtained in S36 and S37 into the measurement data 31 in association with the measurement condition (S38).

If the side under measurement is not one having no adjacent side where a parameter changes in an opposite direction (No in S32), the acquisition unit 43 determines whether the thinning width of the other side belonging to the same group as the side under measurement does has been determined (S39). If the thinning width of the other side has not been determined (No in S39), the processing proceeds to the foregoing S33.

If the thinning width of the other side has been determined (Yes in S39), the acquisition unit 43 waits until the idle time elapses after the switching of the changing parameters (S40). The acquisition unit 43 outputs measurement instructions at timing according to the thinning width determined of the other side, and obtains measurement data according to the thinning width (S41). The storage unit 44 stores the measurement data obtained in S41 into the measurement data 31 in association with the measurement condition (S42).

The output unit 42 determines whether all the operation instructions about the measurement conditions stored in the measurement path information 30 are output to complete the quasi-stationary measurement (S43). If the quasi-stationary measurement is not completed (No in S43), the processing proceeds to the foregoing S31.

If the quasi-stationary measurement is completed (Yes in S43), the model generation unit 45 generates a model by performing machine learning using the measurement conditions stored in the measurement data 31 and the measurement data corresponding to the measurement conditions (S44), and ends the processing.

Effect

As described above, the information processing apparatus 10 according to the present embodiment obtains measurement data by changing the control parameters along the measurement path curve at speed such that the control parameters can be regarded as being stationary, and reducing the measurement intervals in a specific area and increasing the measurement intervals in the areas other than the specific area. In such a manner, the information processing apparatus 10 can obtain measurement data at high density in the specific area during quasi-stationary measurement. The information processing apparatus 10 stores only the measurement data on the measurement points used to generate a model into the memory unit 23. This can reduce the storage area used to store the measurement data.

[d] Fourth Embodiment

Several embodiments of the disclosed apparatus have been described above. However, the disclosed technique can be carried out in various other forms aside from the foregoing embodiments. Other embodiments included in the present invention will be described below.

For example, in the foregoing embodiments, the object to be measured is described to be the engine 11. However, this is not restrictive. For example, the object to be measured may be any object for the state of which it takes time to stabilize at a stationary state after a measurement condition is changed. Examples of the object to be measured may include an actuator, a plant for various types of production, and large machinery.

In the foregoing embodiments, a model is described to be generated with respect to each type of measurement data. However, this is not restrictive. For example, a model for predicting a plurality of types of measurement data may be generated by performing machine learning using the measurement conditions stored in the measurement data 31 and the measurement data on the stationary states corresponding to the measurement conditions. For example, the model generation unit 45 may generate a model for predicting all the types of measurement data.

The components of the illustrated apparatuses are functional, conceptual ones, and do not necessarily need to be physically configured as illustrated. That is, the specific state of distribution and integration of the apparatuses is not limited to the illustrated one. All or part of the apparatuses may be functionally or physically distributed or integrated in arbitrary units according to various types of loads and usages. For example, the processing units including the acceptance unit 40, the measurement condition generation unit 41, the output unit 42, the acquisition unit 43, the storage unit 44, and the model generation unit 45 may be integrated as appropriate. All or an arbitrary part of the processing functions performed by the processing units may be implemented by a CPU and a program that is interpreted and executed by the CPU. All or an arbitrary part of the processing functions may be implemented as hardware by wired logic.

Model Generation Program

Figure 17:
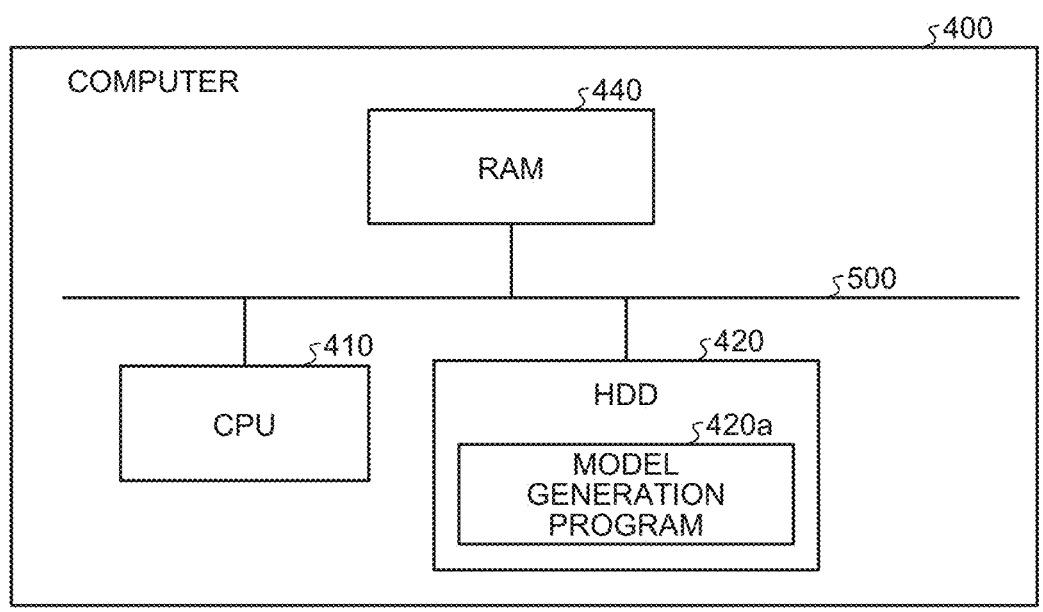
FIG. 17 is an explanatory diagram illustrating an example of a configuration of a computer that executes a model generation program.

Various types of processing described in the foregoing embodiments may be implemented by executing a prepared program by a computer system such as a personal computer and a workstation. An example of a computer system that executes a program having the same functions as those of the foregoing embodiments will be described below. Initially, a model generation program for performing control to call a driver's attention will be described. FIG. 17 is an explanatory diagram illustrating an example of a configuration of a computer that executes the model generation program.

As illustrated in FIG. 17, a computer 400 includes a CPU 410, a hard disk drive (HDD) 420, and a RAM 440. Such components 400 to 440 are connected via a bus 500.

A model generation program 420a for providing the same functions as those of the acceptance unit 40, the measurement condition generation unit 41, the output unit 42, the acquisition unit 43, the storage unit 44, and the model generation unit 45 described above is stored in the HDD 420 in advance. The model generation program 420a may be divided as appropriate.

The HDD 420 stores various types of information. For example, the HDD 420 stores an OS and various types of data.

The CPU 410 reads the model generation program 420a from the HDD 420 and executes the model generation program 420a, whereby the same operations as those of the processing units according to the embodiments are performed. Specifically, the model generation program 420a performs the same operations as those of the acceptance unit 40, the measurement condition generation unit 41, the output unit 42, the acquisition unit 43, the storage unit 44, and the model generation unit 45.

The model generation program 420a does not necessarily need to be stored in the HDD 420 from the beginning.

For example, the model generation program 420a may be stored in a "portable physical medium" inserted into the computer 400, such as a flexible disk (FD), CD-ROM, DVD disk, magneto-optic disk, and IC card. The computer 400 may read the program from such a medium and execute the program.

The program may be stored in "another computer (or server)" or the like that is connected to the computer 400 via a public line, the Internet, a LAN, a WAN, or the like. The computer 400 may read the program from such a computer (or server) and execute the program.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium having stored therein a model generation program that causes a computer to execute a process comprising:

setting a plurality of control parameters of a target object of a control design, normalizing a measurement target range of the plurality of control parameters to generate a normalized space, laying out a measurement path curve which is a Hilbert curve in the normalized space, generating a measurement condition corresponding to each point on the measurement path curve by sequentially changing one of the plurality of control parameters along the measurement path curve, obtaining measurement data based on the generated measurement condition, storing the obtained measurement data by associating with a point on the measurement path curve, generating a control model based on the obtained measurement data, and applying the control model to the target object to thereby determine an actual value of the plurality of control parameters.

2. The non-transitory computer-readable recording medium according to claim 1, wherein the generating generates the control model by obtaining the measurement data corresponding to measurement points on two different sides of the Hilbert curve, the change of the control parameter being in reverse on the two different sides, wherein a number of the obtained measurement data on each side are substantially the same, and the two sides are adjacent to each other.

3. The non-transitory computer-readable recording medium according to claim 1, wherein the generating generates the control model by obtaining more measurement data from one area of the measurement path curve than from another area of the measurement path curve.

4. The non-transitory computer-readable recording medium according to claim 1, wherein the generating includes, when solving an optimization problem for minimization, obtaining first measurement data by a larger number than second measurement data whose value is larger than the first measurement data, and when solving an optimization problem for maximization, obtaining the second measurement data a larger number than the first measurement data.

5. The non-transitory computer-readable recording medium according to claim 1, wherein the generating includes, when solving an optimization problem focusing on a predetermined value, obtaining first measurement data by a larger number than second measurement data whose difference from a predetermined value being larger than a difference of the first measurement data from the predetermined value.

6. A model generation method comprising:

setting a plurality of control parameters of a target object of a control design, normalizing a measurement target range of the plurality of control parameters to generate a normalized space, laying out a measurement path curve which is a Hilbert curve in the normalized space, generating a measurement condition corresponding to each point on the measurement path curve by sequentially changing one of the plurality of control parameters along the measurement path curve, obtaining measurement data based on the generated measurement condition, storing the obtained measurement data by associating with a point on the measurement path curve, generating a control model based on the obtained measurement data, and applying the control model to the target object to thereby determine an actual value of the plurality of control parameters.

7. An information processing apparatus comprising:
a memory; and
a processor coupled to the memory and configured to:
set a plurality of control parameters of a target object of a control design,
normalize a measurement target range of the plurality of control parameters to generate a normalized space,
lay out a measurement path curve which is a Hilbert curve in the normalized space,
generate a measurement condition corresponding to each point on the measurement path curve by sequentially changing one of the plurality of control parameters along the measurement path curve,
obtain measurement data based on the generated measurement condition,
store the obtained measurement data by associating with a point on the measurement path curve,
generate a control model based on the obtained measurement data, and
apply the control model to the target object to thereby determine an actual value of the plurality of control parameters.

* * * * *